(12) United States Patent
Kishida

(10) Patent No.: US 8,564,037 B2
(45) Date of Patent: Oct. 22, 2013

(54) SEMICONDUCTOR DEVICE HAVING ISOLATION GROOVE AND DEVICE FORMATION PORTION

(75) Inventor: Takeshi Kishida, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 132 days.

(21) Appl. No.: 13/012,305

(22) Filed: Jan. 24, 2011

(65) Prior Publication Data

US 2011/0186968 A1 Aug. 4, 2011

(30) Foreign Application Priority Data

Jan. 29, 2010 (JP) ................................. 2010-019278

(51) Int. Cl.
*H01L 27/108* (2006.01)

(52) U.S. Cl.
USPC .................... 257/296; 257/621; 257/E27.084

(58) Field of Classification Search
USPC .......... 257/296, 313, 618, 621, 622, E29.026, 257/E27.06, E27.084, E27.085–E27.097, 257/E29.242

See application file for complete search history.

(56) References Cited

U.S. PATENT DOCUMENTS

2002/0005542 A1* 1/2002 Hayano et al. ................ 257/306

FOREIGN PATENT DOCUMENTS

| JP | 2002-203895 | 7/2002 |
| JP | 2007-158269 | 6/2007 |

* cited by examiner

*Primary Examiner* — Tucker Wright
(74) *Attorney, Agent, or Firm* — Young & Thompson

(57) ABSTRACT

A semiconductor device may include, but is not limited to, a semiconductor substrate having a device isolation groove defining first to fourth device formation portions. The second device formation portion is separated from the first device formation portion. The third device formation portion extends from the first device formation portion. The third device formation portion is separated from the second device formation portion. The fourth device formation portion extends from the second device formation portion. The fourth device formation portion is separated from the first and third device formation portions. The third and fourth device formation portions are positioned between the first and second device formation portions.

20 Claims, 35 Drawing Sheets

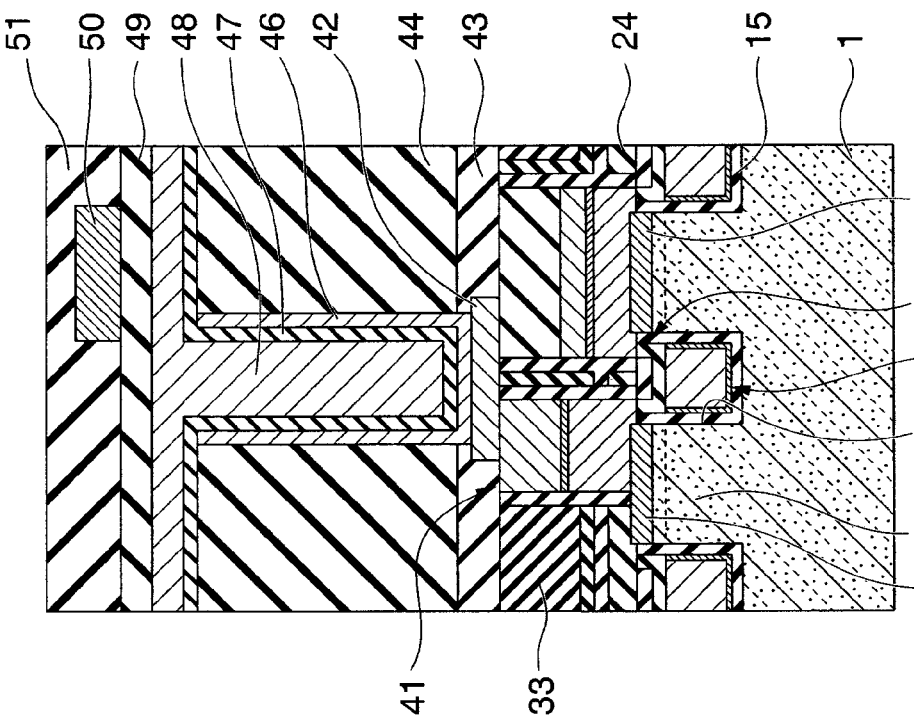
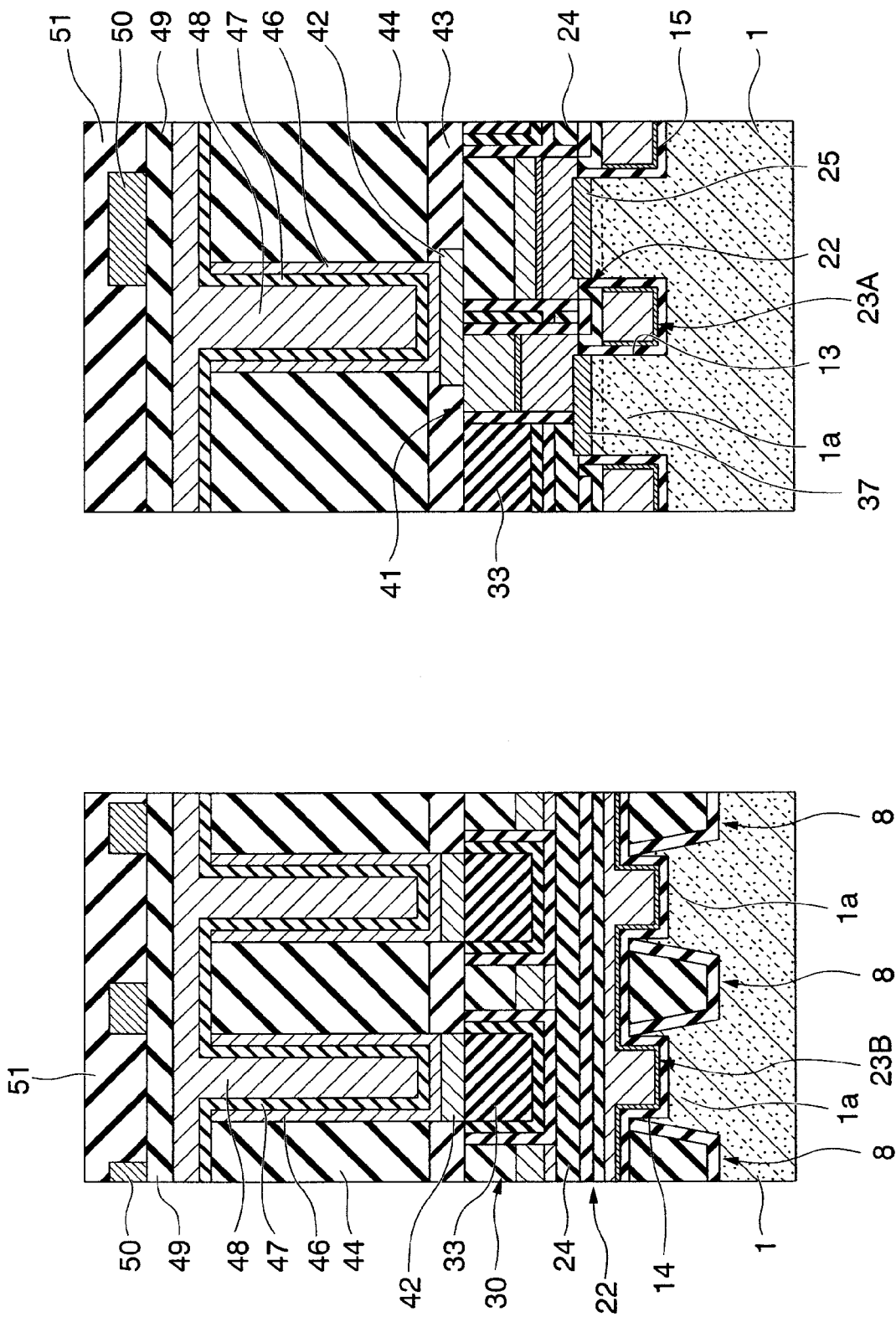

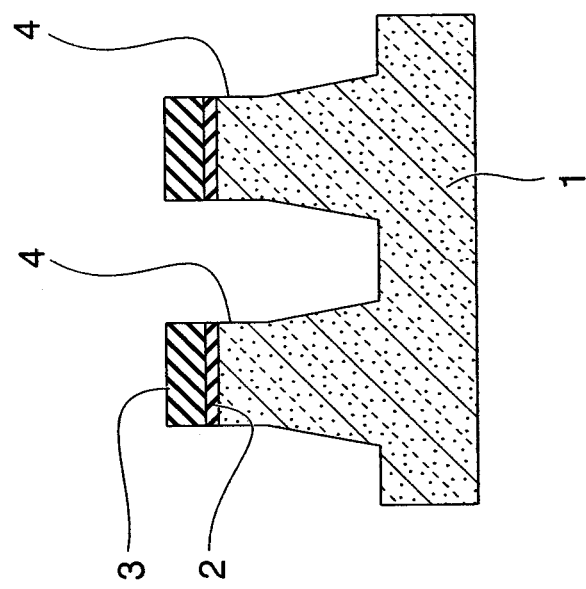
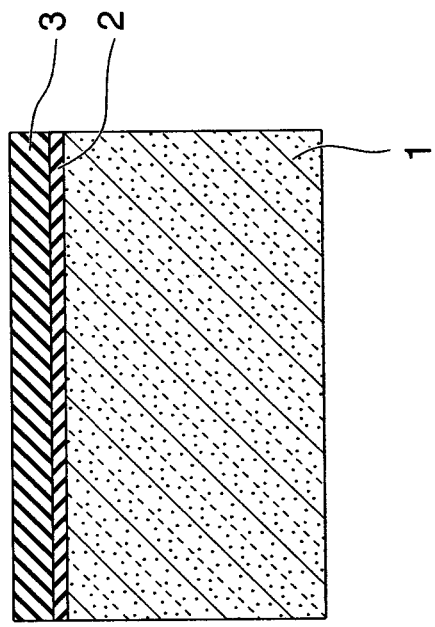
FIG. 3A
FIG. 3B

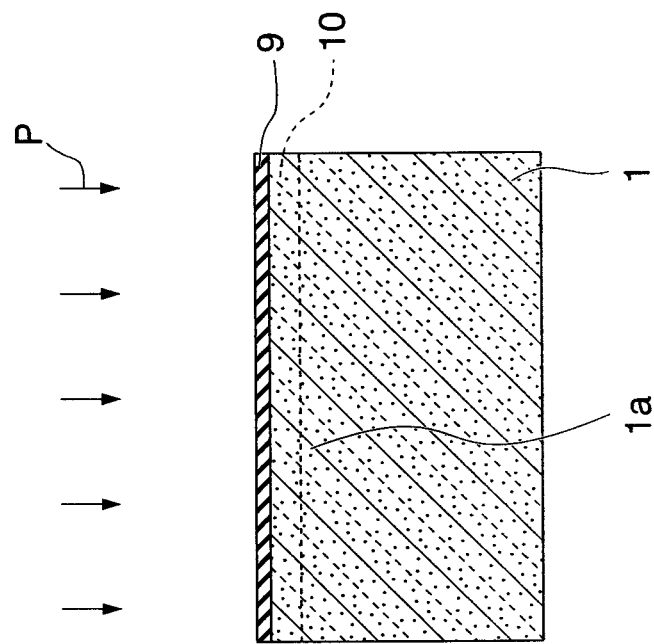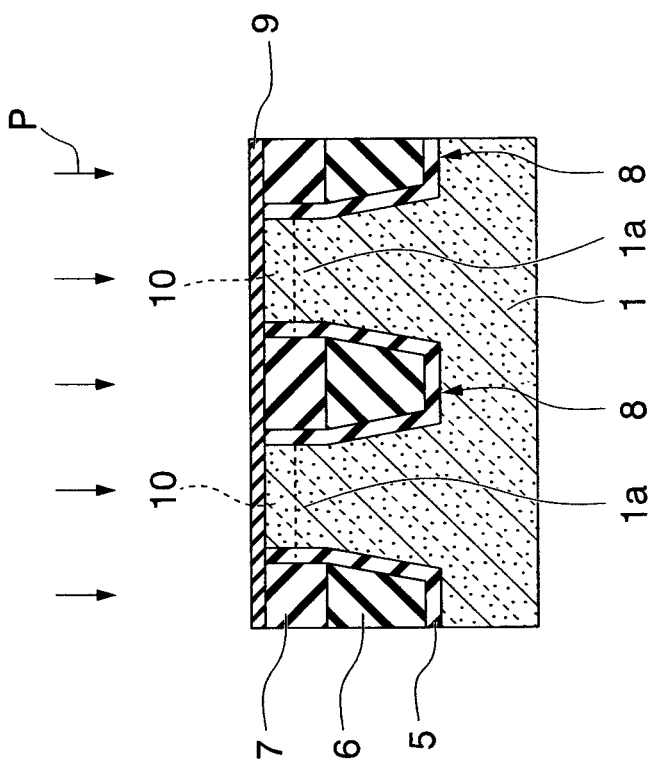

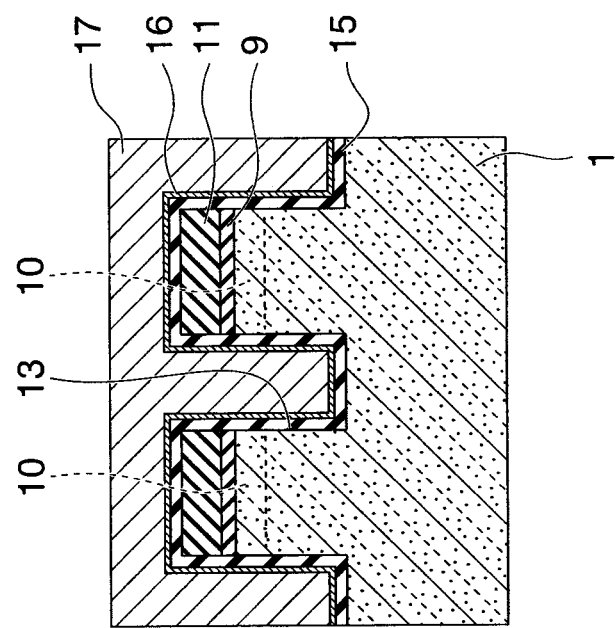
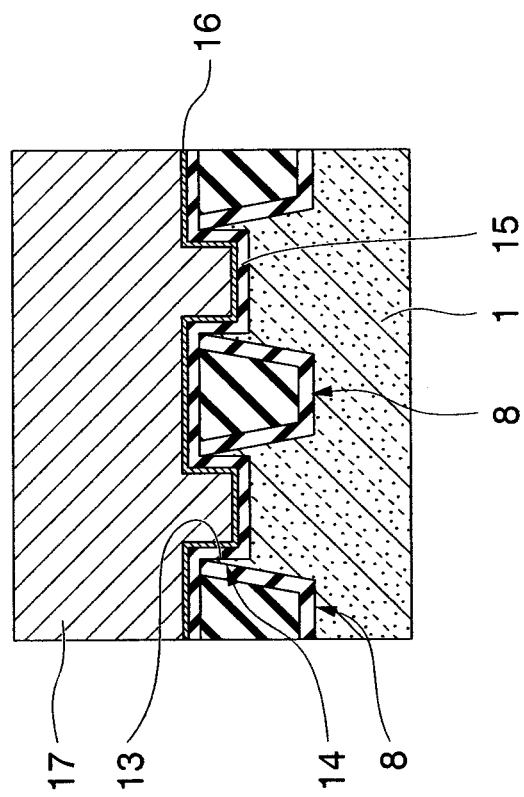

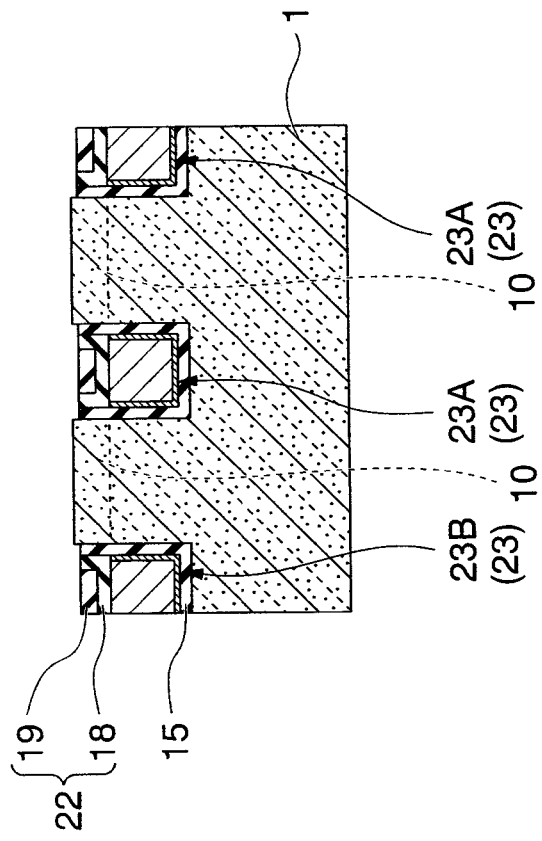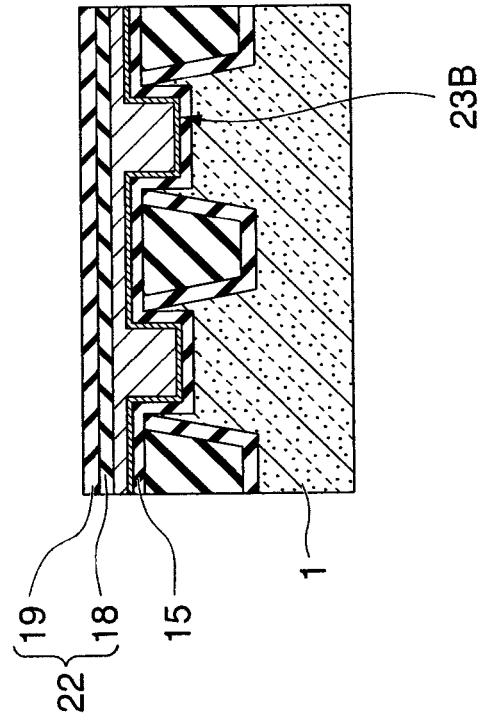

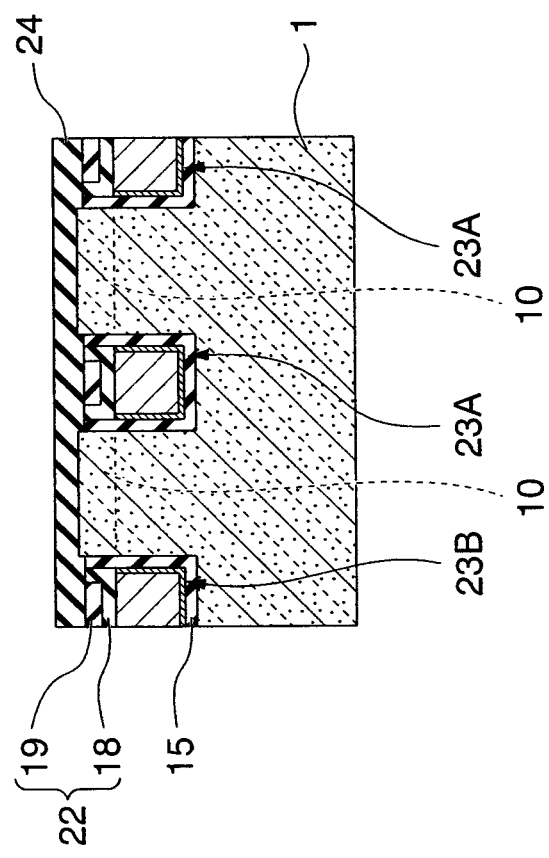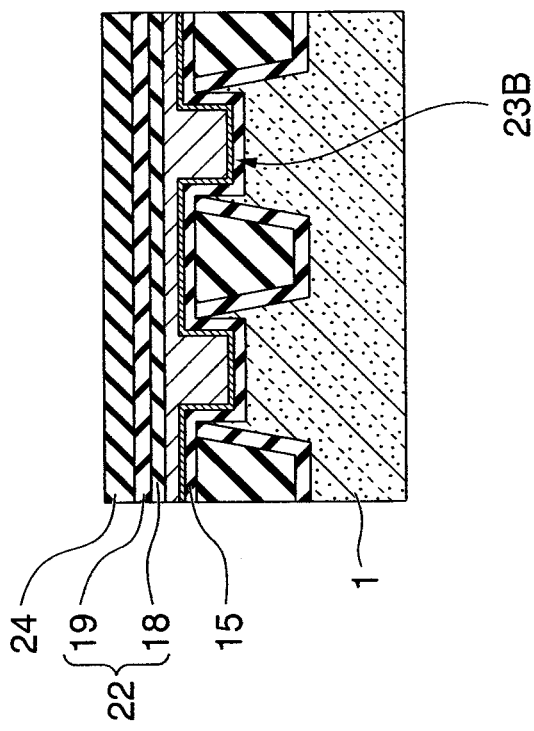

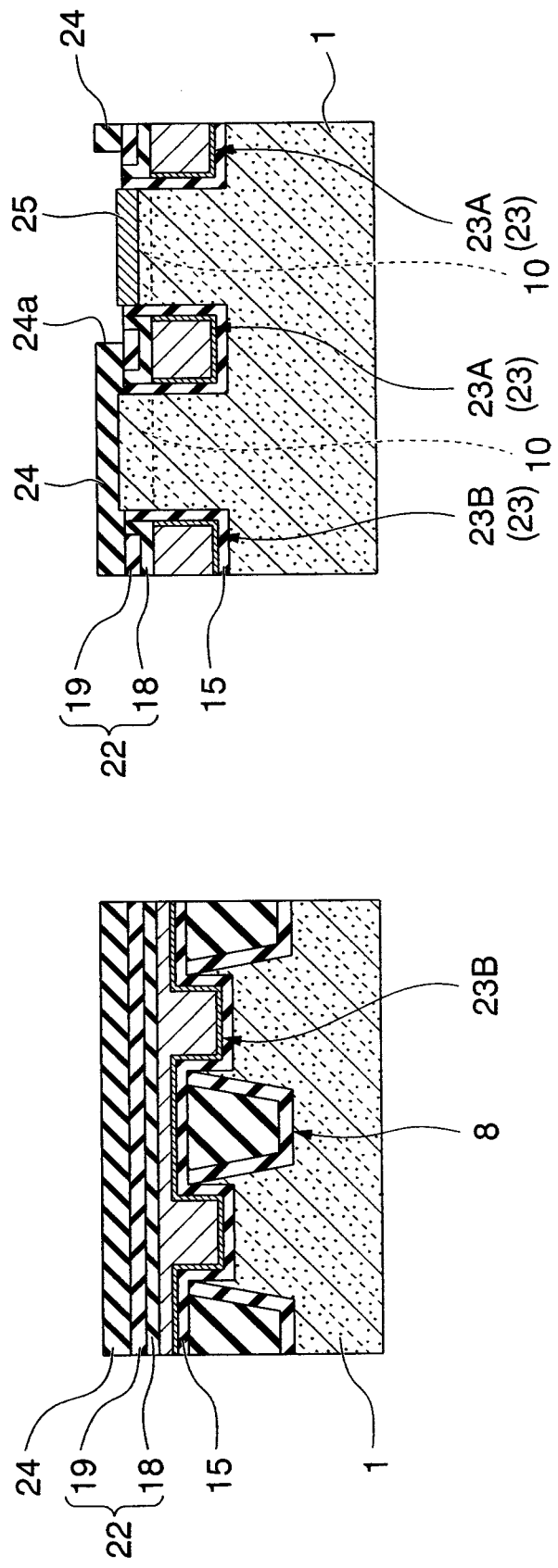

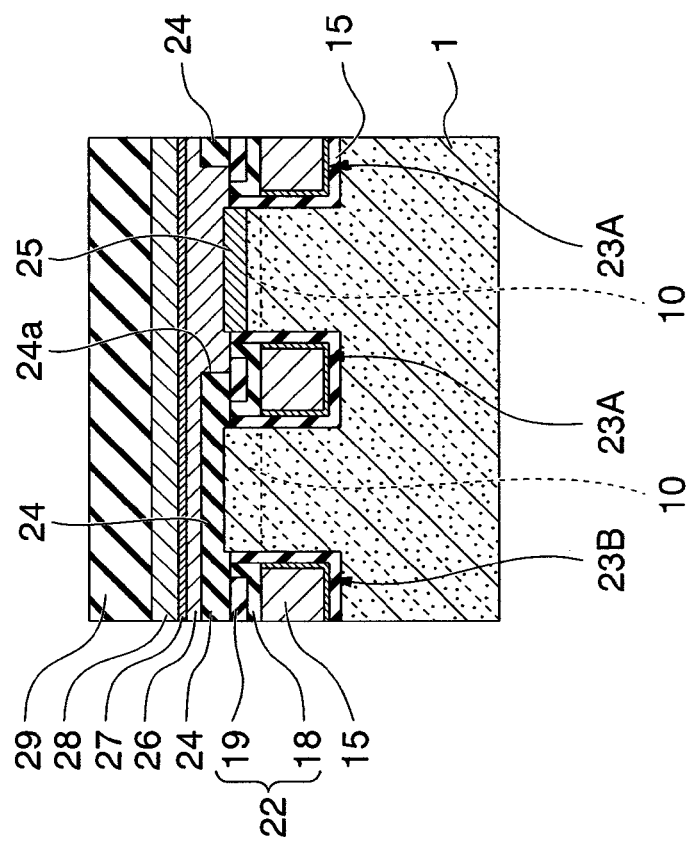
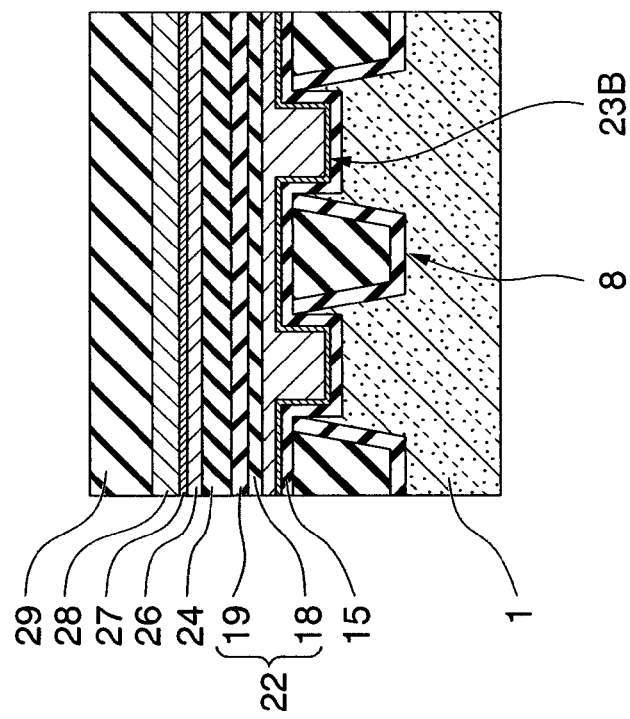

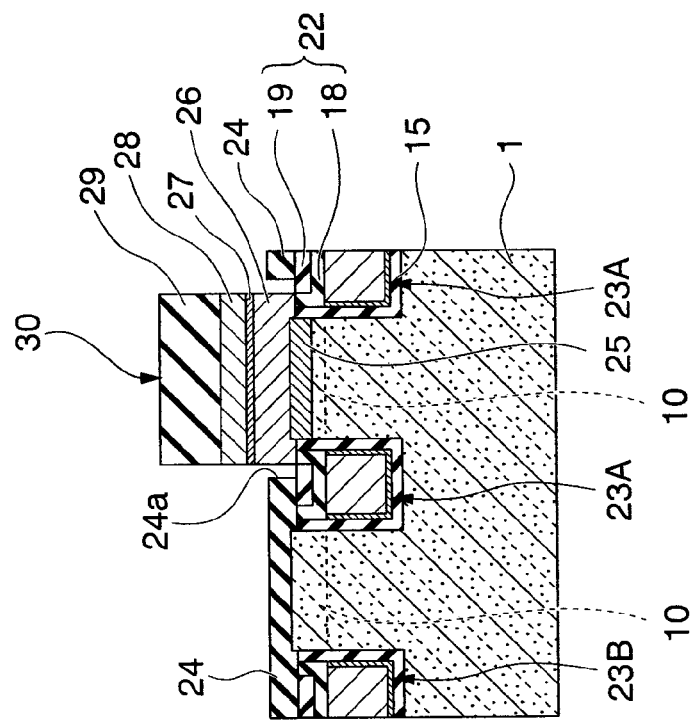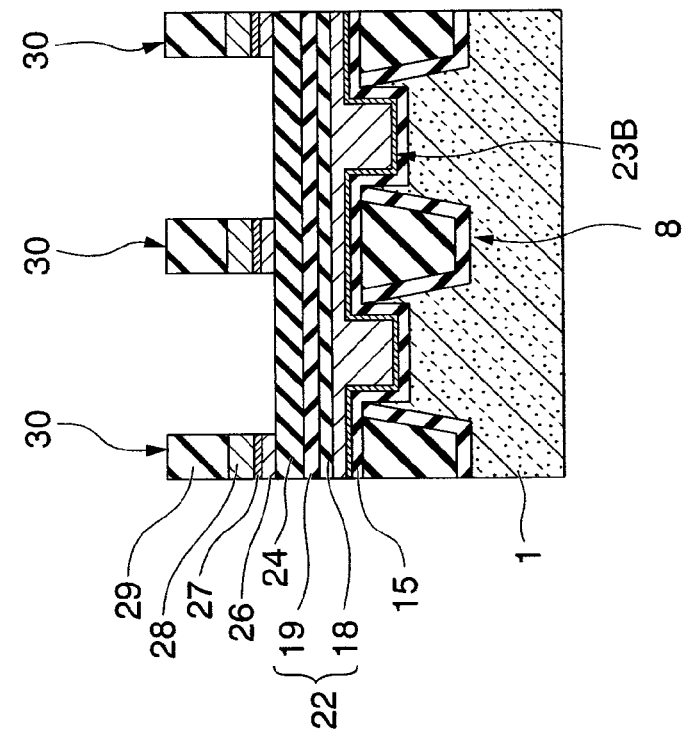

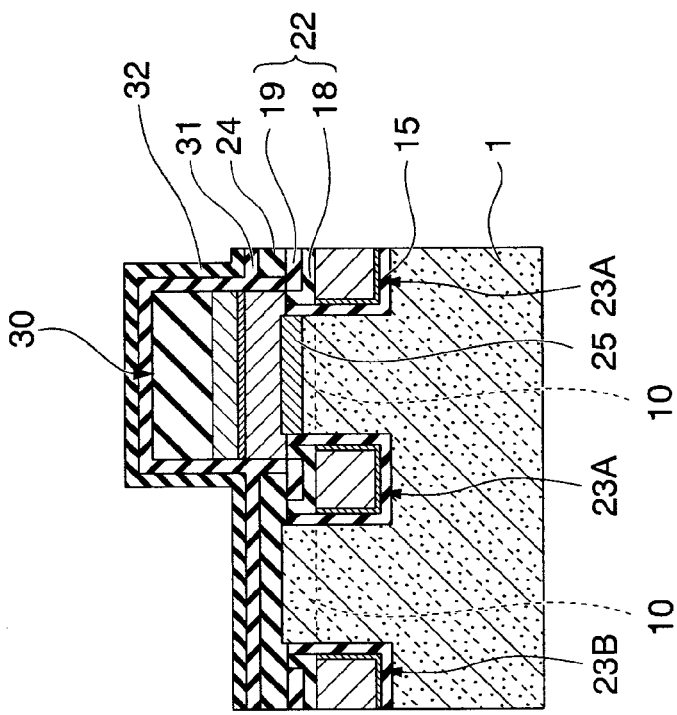
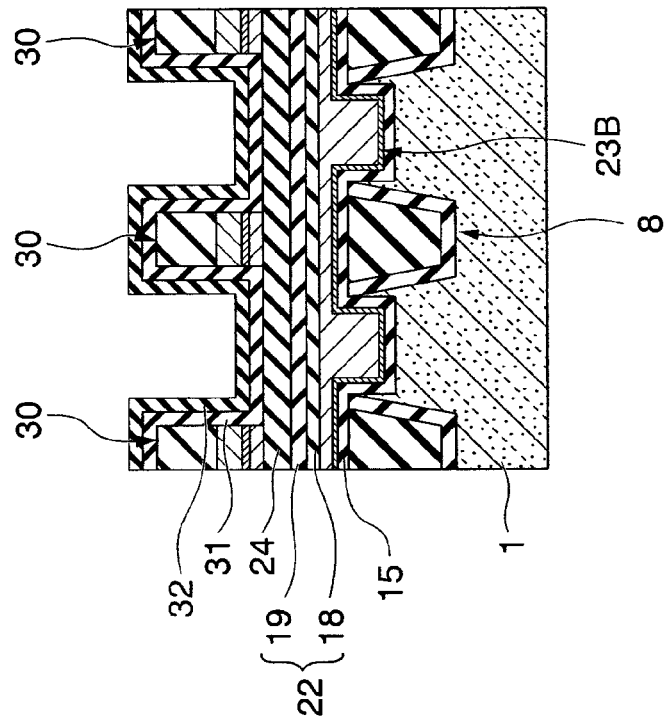

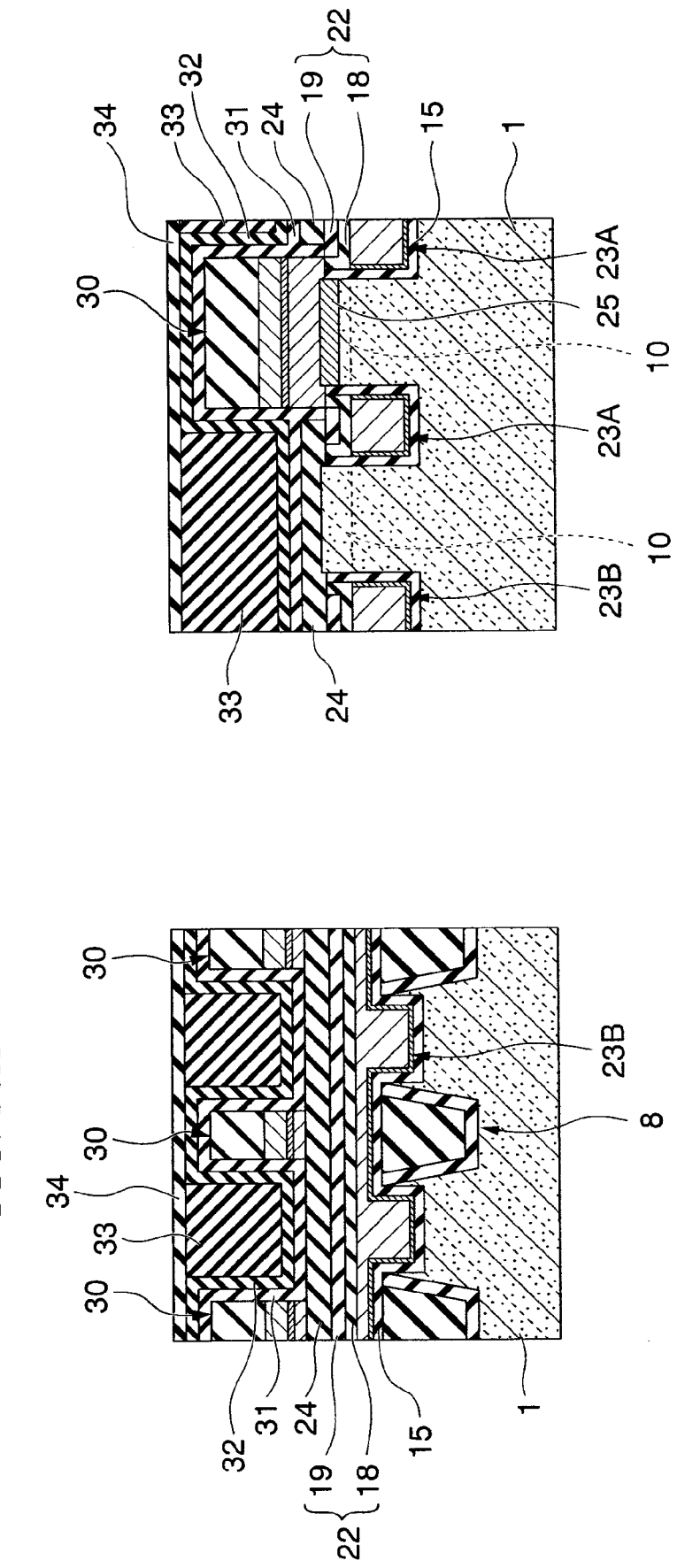

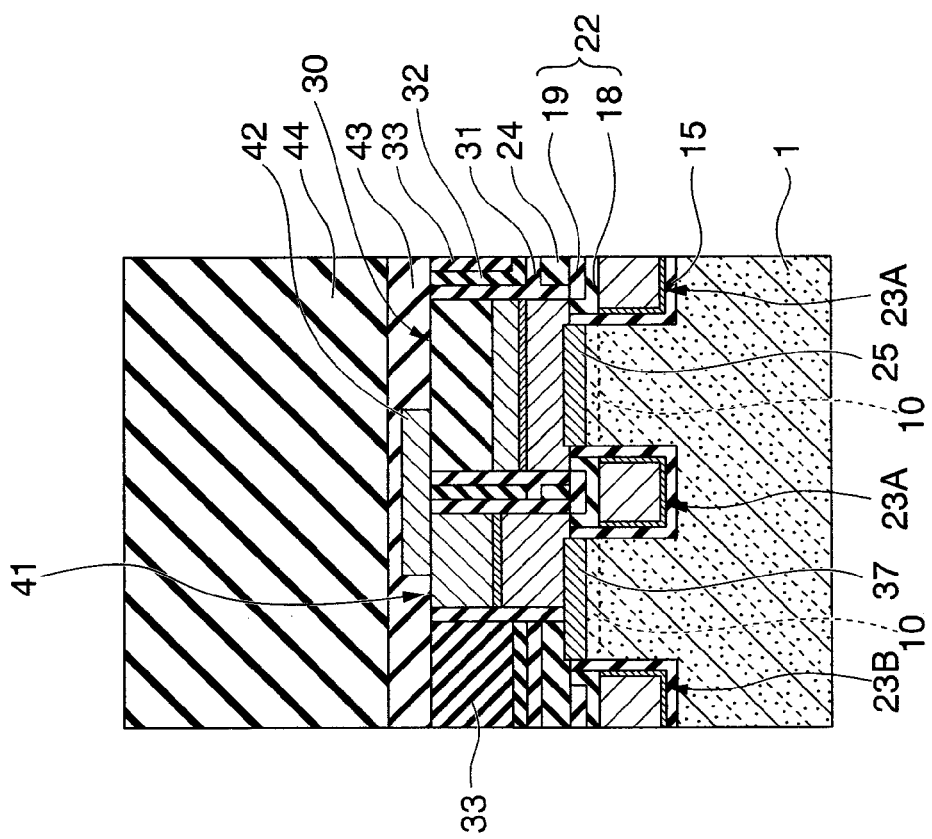
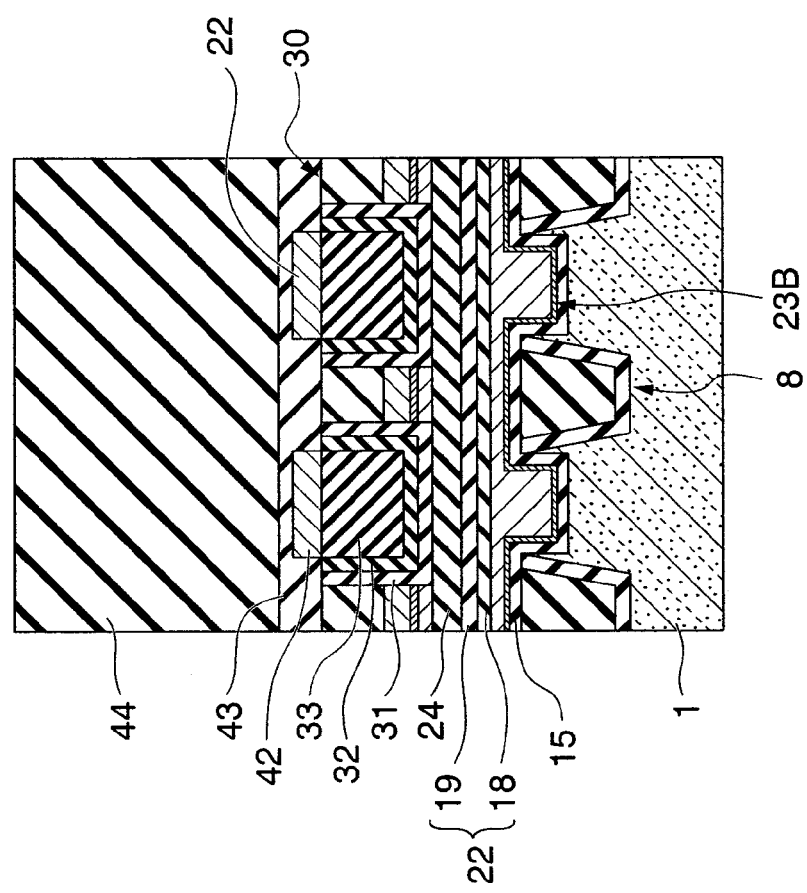
FIG. 22A
FIG. 22B

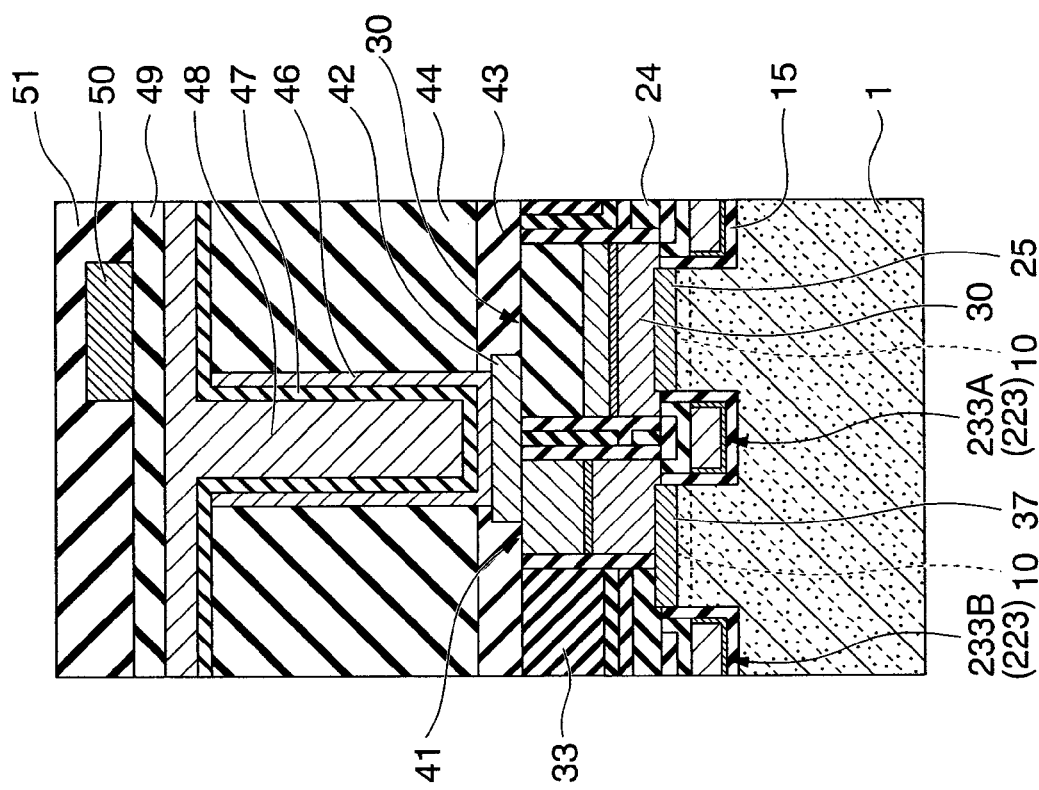
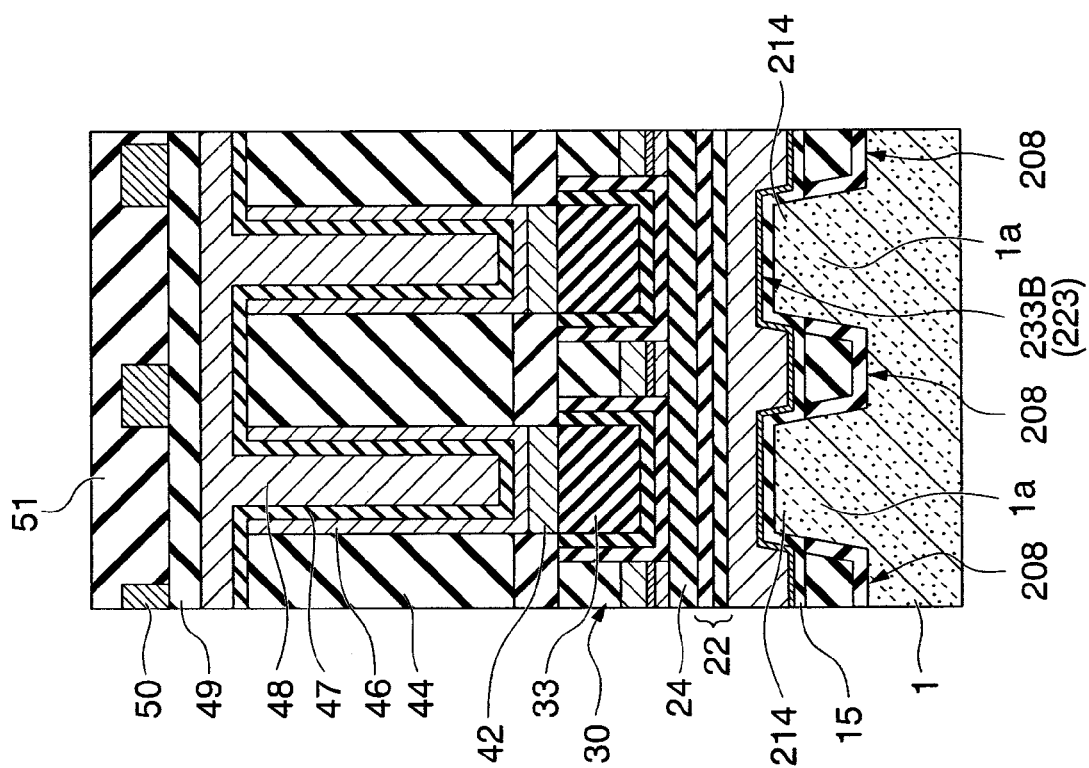
FIG. 27A
FIG. 27B

SEMICONDUCTOR DEVICE HAVING ISOLATION GROOVE AND DEVICE FORMATION PORTION

BACKGROUND OF THE INVENTION

1. Field of the Invention

The present invention relates to a semiconductor device and a method of manufacturing the same.

Priority is claimed on Japanese Patent Application No. 2010-019278, filed Jan. 29, 2010, the content of which is incorporated herein by reference.

2. Description of the Related Art

With the higher integration of semiconductor devices, semiconductor elements used for semiconductor devices have been miniaturized. Recently, an STI (Shallow Trench Isolation) film, which is formed by filling a groove in a semiconductor layer with an insulating film, has been used. However, with the miniaturization of semiconductor elements, it has been becoming more difficult to fill a groove in a semiconductor layer with an STI film, thereby causing defective formation of the STI film.

For this reason, as a method of forming an STI film, Japanese Patent Laid-Open Publication No. 2002-203895 discloses a method of filling a groove in a semiconductor layer with an SOD (Spin On Dielectric) film and a silicon oxide ($SiO_2$) film. The SOD film is formed by applying polysilazane or the like. The silicon oxide film is formed by a CVD (Chemical Vapor Deposition) method.

With the miniaturization of semiconductor elements, new type transistors have been used in lieu of the conventional planer transistors. New type transistors include a trench gate transistor that prevents the short channel effect. Japanese Patent Laid-Open Publication No. 2007-158269 discloses a trench gate transistor including a channel layer covering a side surface of a gate electrode trench.

However, even if the method of filling a groove in a semiconductor substrate with two insulating layers is used to form an STI film, defectives, such as voids, are included in the STI film in some cases.

Hereinafter, the problems of the semiconductor devices of the related art are explained in detail. FIG. 31A is a plan view illustrating one of processes included in a method of forming a DRAM (Dynamic Random Access Memory) according to the related art. FIG. 31B is an enlarged plan view illustrating part of a device formation region shown in FIG. 31A.

A semiconductor memory device shown in FIG. 31A has a memory cell region 100a and a peripheral region 100b outside the memory cell region 100a. The memory cell region 100a includes an STI film 800 and device formation regions 110a defined by the STI film 800. The STI film 800 is formed by filling a device isolation groove 400 in a semiconductor substrate 100 with a two-layered insulating film including a silicon nitride film and a silicon oxide film.

The device isolation groove 400, which defines a planar shape of the STI film 800, includes multiple linear grooves 401 and a connection groove 402. The linear grooves 401 extend in a direction crossing the Y direction shown in FIG. 31A. The connection groove 402 extends in the X and Y directions shown in FIG. 31A and connects the linear grooves 401.

A planar shape of the device formation region 110a is defined by the planar shape of the STI film 800. The device formation region 110a includes a first band portion 121, a second band portion 122, and multiple device formation portions 123. The first and second band portions 121 and 122 extend in the Y direction. The first and second band portions 121 and 122 oppose each other. The device formation portions 123 are positioned between the first and second band portions 121 and 122, and extend in a direction crossing the Y direction. Both ends 123a of each device formation portion 123 are separated from the first and second band portions 121 and 122.

Hereinafter, a method of forming the STI film 800 is explained. FIGS. 32A, 32B, 33A to 33D, 34A and 34B are cross-sectional views illustrating a process of forming the STI film 800 of the DRAM shown in FIGS. 31A and 31B. FIGS. 32A, 33A, and 34A are cross-sectional views taken along line A-A' shown in FIG. 31B. FIGS. 32B, 33B, and 34B are cross-sectional views taken along line D-D' shown in FIG. 31B. FIG. 33C is a cross-sectional view taken along line B-B' shown in FIG. 31B. FIG. 33D is a cross-sectional view taken along line C-C' shown in FIG. 31B. FIG. 32C is a perspective view illustrating the process. The lines C-C' and D-D' shown in FIG. 32C correspond to lines C-C' and D-D' shown in FIG. 31B.

To form the STI film 800 shown in FIGS. 31A and 31B, the device isolation groove 400, which includes the linear grooves 401 and the connection groove 402, is formed first, as shown in FIGS. 32A to 32C. Then, a silicon nitride film 601 is formed so as to fill the device isolation groove 400.

Then, a silicon nitride film 601 is partially removed by a wet etching process so that the silicon nitride film 600 remains in a bottom portion of the device isolation groove 400. The wet etching process is carried out such that the top level of the silicon nitride film 600 included in the linear grooves 401 matches a dotted line shown in FIGS. 33A to 33D.

After the wet etching process, the top level of the silicon nitride film 600 is highest in the longitudinal center region of the linear groove 401 as shown in FIG. 33A, and is lowest in the region of the connection groove 402 as shown in FIG. 33B. The top level of the silicon nitride film 600 decreases from the longitudinal center region of the linear groove 401 toward the connection groove 402, as shown in FIGS. 33A, 33C, and 33D.

After the wet etching process, a silicon oxide film is formed so as to fill the element formation groove 400. Then, a surface of the semiconductor substrate 100 is planarized. Thus, the two-layered STI film 800, which includes the silicon nitride film 600 and the silicon oxide film 700 over the silicon nitride film 600, can be formed as shown in FIGS. 34A and 34B.

In the case of the STI film 800 shown in FIGS. 31A and 31B, defectives, such as voids, have been likely to be included in the silicon oxide film 700 which is close to the connection groove 402.

The cause of the defectives is considered to be a variation in the top level of the silicon nitride film 600 filling the bottom portion of the device isolation groove 400. The variation in the top level of the silicon nitride film 600 is caused by an etchant for wet-etching the silicon nitride film 601 entering the narrow linear groove 401 from the wide connection groove 402. Consequently, the top level of the silicon nitride film 600 at a position close to the connection groove 402 becomes lower than that at the longitudinal center of the linear groove 401.

As a result, the aspect ratio of the linear groove 401 at a position close to the connection groove 402 becomes greater than that at other positions when the silicon oxide film 700 is formed after the silicon nitride film 600 is formed. Defectives are likely to occur at a portion of the linear groove 401 which has the great aspect ratio. Therefore, it can be considered that defectives, such as voids, are likely to be included in the silicon oxide film 700 filling the linear groove 401 that is close to the connection groove 402.

FIG. 35A is a plan view illustrating one of processes included in a method of forming another semiconductor memory device (DRAM) according to the related art. FIG. 35B is an enlarged view illustrating part of a memory cell region shown in FIG. 35A.

The semiconductor memory device shown in FIG. 35A differs from the semiconductor memory device shown in FIG. 31A in planar shapes of an STI film 801, a device isolation groove 410, and a device formation region 111a. Therefore, explanations of other elements are omitted here. The STI film 801 of the semiconductor memory device shown in FIGS. 35A and 35B is formed by the same method by which the STI film 800 shown in FIGS. 31A and 31B is formed.

As shown in FIG. 35A, the device isolation groove 410, which defines a planar shape of the STI film 801, includes multiple linear grooves 411. The linear grooves 411 extend in a direction crossing the Y direction shown in FIG. 35A.

A planar shape of the device formation region 111a shown in FIG. 35 is defined by the planar shape of the STI film 801. The device formation region 111a includes a first band portion 131, a second band portion 132, and multiple device formation portions 133. The first and second band portions 131 and 132 extend in the Y direction. The first and second band portions 131 and 132 oppose each other. The device formation portions 133 are positioned between the first and second band portions 131 and 132, and extend in a direction crossing the Y direction. Both ends 133a of each device formation portion 133 are connected to the first and second band portions 131 and 132.

In the case of the STI film 801 shown in FIG. 35, defectives, such as voids, have been likely to be included in the silicon oxide film 700 filling the end potions of the linear groove 411. The cause of the defectives is probably that the width of the linear groove 411 becomes narrower toward the end portion of the linear groove 411. The narrower the width of the linear groove 411 becomes, the greater the aspect ratio of the linear groove 411 becomes. For this reason, in the case of the STI film 801 shown in FIGS. 35A and 35B, defectives, such as voids, have been likely to be included in the silicon oxide film 700 filling the end portions of the linear groove 411.

SUMMARY

In one embodiment, a semiconductor device may include, but is not limited to, a semiconductor substrate having a device isolation groove defining first to fourth device formation portions. The second device formation portion is separated from the first device formation portion. The third device formation portion extends from the first device formation portion. The third device formation portion is separated from the second device formation portion. The fourth device formation portion extends from the second device formation portion. The fourth device formation portion is separated from the first and third device formation portions. The third and fourth device formation portions are positioned between the first and second device formation portions.

In another embodiment, a semiconductor device may include, but is not limited to, a semiconductor substrate having first to fifth device isolation grooves. The first device isolation groove has a first end portion. The second device isolation groove extends from the first end portion. The second device isolation groove has a second end portion other than the first end portion. The third device isolation groove extends from the second end portion. The third device isolation groove has a third end portion other than the second end portion. The first and third device isolation grooves are positioned on the same side with respect to the second device isolation groove. The fourth device isolation groove extends from the third end portion. The fourth device isolation groove has a fourth end portion other than the third end portion. The second and fourth device isolation grooves are positioned on the opposite side with respect to the third device isolation groove. The fifth device isolation groove extends from the fourth end portion. The third and fifth device isolation grooves are positioned on the same side with respect to the fourth device isolation groove.

In still another embodiment, a semiconductor device may include, but is not limited to: a semiconductor substrate; a first insulating film; a second insulating film; and a gate electrode film. The semiconductor substrate has a groove and first and second portions defined by the groove. The first and second portions extend upwardly. The first insulating film fills a bottom portion of the groove. The second insulating film covers the first insulating film and the first and second portions. The second insulating film includes a third portion covering the first insulating film. The top level of the third portion is lower than the top levels of the first and second portions. The gate electrode film covers the second insulating film.

BRIEF DESCRIPTION OF THE DRAWINGS

The above features and advantages of the present invention will be more apparent from the following description of certain preferred embodiments taken in conjunction with the accompanying drawings, in which:

FIG. 2A is a cross-sectional view taken along line A-A' shown in FIG. 1;

FIG. 2B is a cross-sectional view taken along line B-B' shown in FIG. 1;

FIGS. 3A to 25A are cross-sectional views taken along the line A-A' illustrating a process flow indicative of a method of manufacturing the semiconductor device according to the first embodiment;

FIGS. 3B to 25B are cross-sectional views taken along the line B-B' illustrating the process flow according to the first embodiment;

FIGS. 27A and 27B are cross-sectional views illustrating a memory cell of a semiconductor device according to a second embodiment of the present invention;

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

First Embodiment

Figure 1:
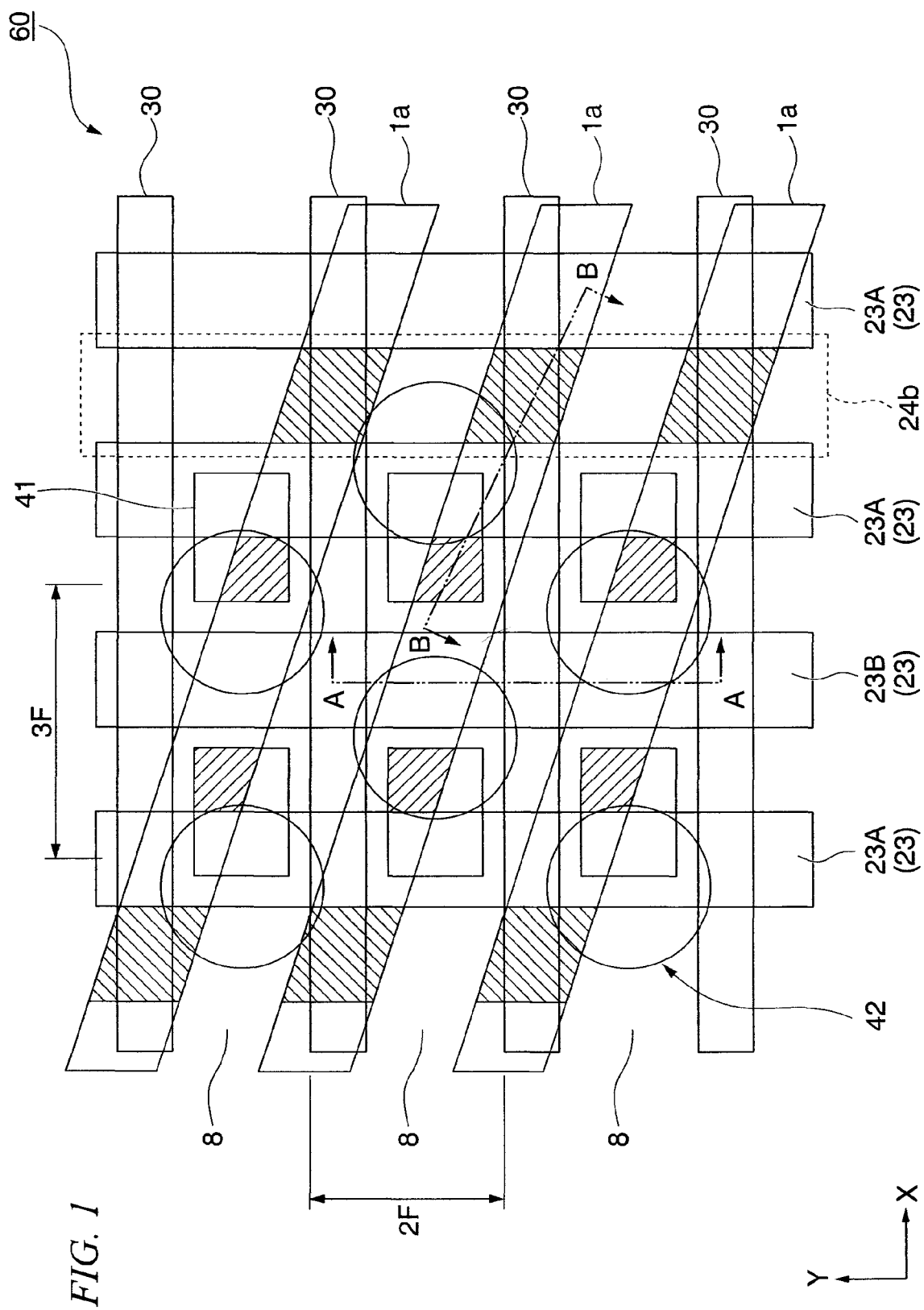
FIG. 1 is a plan view illustrating a memory cell region of a semiconductor device according to a first embodiment of the present invention.
Figure 30A:
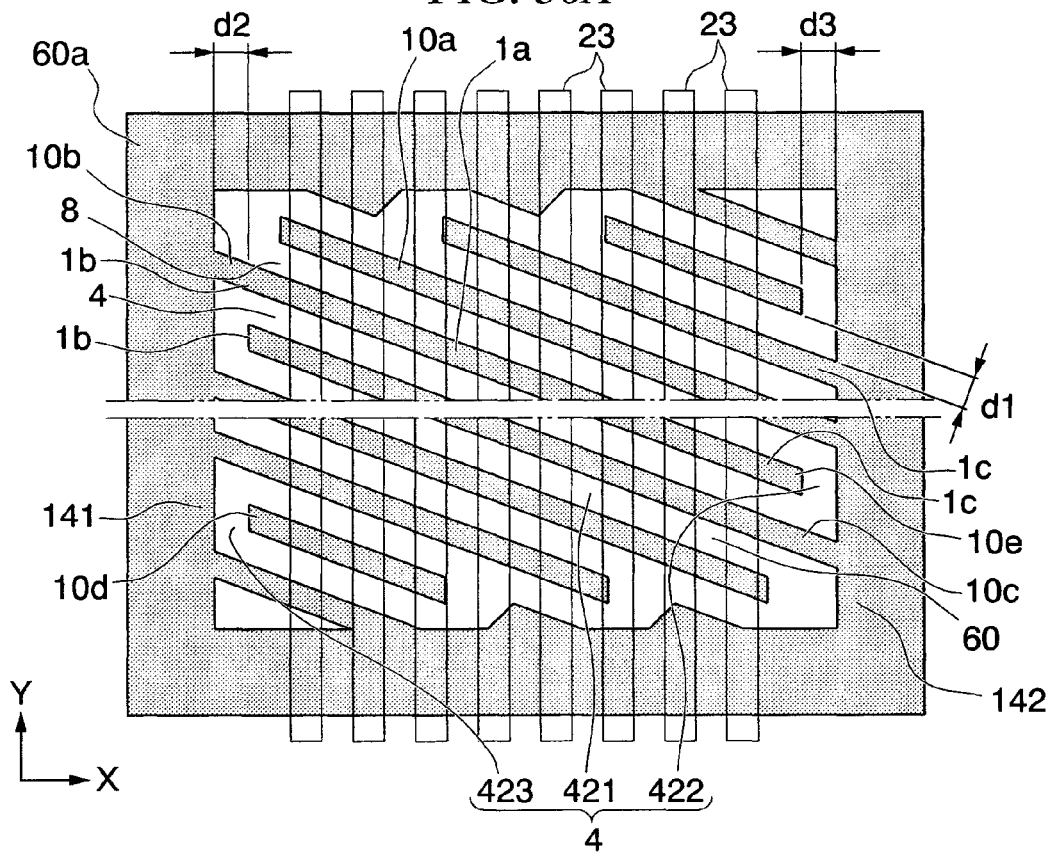
FIG. 30A is a plan view illustrating only device isolation grooves, a device isolation film, a device formation region, and buried wires of the semiconductor device according to the first embodiment.
Figure 30B:
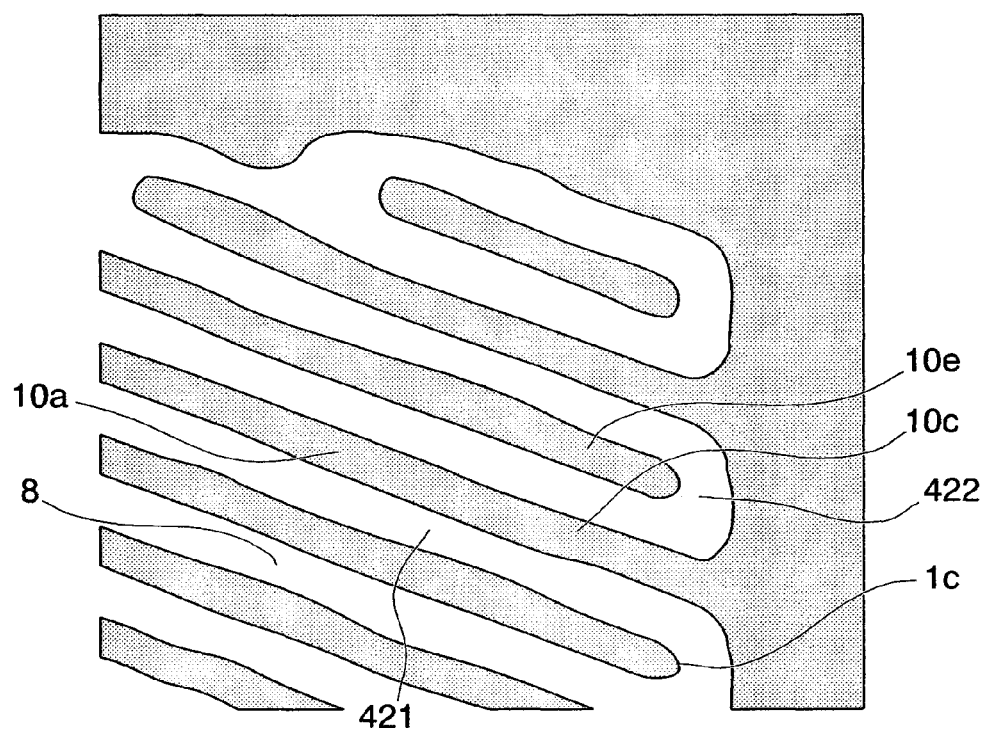
FIG. 30B is an enlarged plan view illustrating part of the device formation region shown in FIG. 30A.

Hereinafter, a semiconductor device (DRAM) according to a first embodiment of the present invention is explained. FIG. 1 is a plan view illustrating a memory cell region of the semiconductor device of the first embodiment. FIG. 30A is a plan view illustrating only device isolation grooves, a device isolation film, a device formation region, and buried wires. FIG. 30B is an enlarged plan view illustrating part of the device formation region shown in FIG. 30A. FIG. 2A is a cross-sectional view taken along line A-A' shown in FIG. 1. FIG. 2B is a cross-sectional view taken along line B-B' shown in FIG. 1.

The semiconductor device (semiconductor memory device) of the first embodiment has a memory cell region 60 and a peripheral region 60a outside the memory cell region 60, as shown in FIGS. 1 and 30A. A drive transistor (not shown) is provided in the peripheral region 60a.

The memory cell region 60 includes an STI film (device isolation film) 8 and device formation regions 10a defined by the STI film (device isolation film) 8. The STI film 8 is formed by filling an element formation groove 4 in a semiconductor substrate 1 with a two-layered insulating film including a silicon nitride film and a silicon oxide film. A planar shape of the STI film 8 is defined by the element formation groove 4.

As shown in FIGS. 30A and 30B, the element formation groove 4 includes linear grooves 421, first connection grooves 422, and second connection grooves 423. The linear grooves 421 extend in a direction crossing a Y direction shown in FIG. 1. Each first connection groove 422 connects right end portions of a pair of adjacent linear grooves 421 in the Y direction. Each second connection groove 423 connects left end portions of a pair of adjacent linear grooves 421 in the Y direction.

Specifically, when first to four adjacent linear grooves 421 extend in parallel, the right end portions of the first and second linear grooves 421 are connected by one of the first connection grooves 422. Additionally, the left end portions of the second and third linear grooves 421 are connected by one of the second connection grooves 423. Further, the right end portions of the third and fourth linear grooves 421 are connected by another one of the first connection grooves 422.

Thus, the first connection groove 422 does not connect all the right end portions of the linear grooves 421. The second connection groove 423 does not connect all the left end portions of the linear grooves 421. The first connection grooves 422, the second connection grooves 423, and the linear grooves 421 are connected in a zig-zag manner.

The width d1 of the linear groove 421, the width d2 of the second connection groove 423, and the width d3 of the first connection groove 422 are all the same. The width d2 of the second connection groove 423 indicates the width thereof in the X direction. The width d3 of the first connection groove 422 indicates the width thereof in the X direction.

When the widths d1 to d3 are all the same, a variation in width of the device isolation groove 4 is very small, and thereby a variation in the aspect ratio of the device isolation groove 4 is also very small. For this reason, defectives, such as voids, can be prevented from occurring when the STI film 8 is formed by filling the element formation groove 4 with an insulating film.

The planar shape of the device formation region 10a is defined by the planar shape of the STI film 8 as shown in FIGS. 30A and 30B. The device formation region 10a shown in FIG. 1 includes a first band portion 141, a second band portion 142, and multiple device formation portions 1a. The first and second band portions 141 and 142 extend in the Y direction, and oppose each other. The device formation portions 1a are positioned between the first and second band portions 141 and 142, and extend in a direction crossing the Y direction.

The device formation portions 1a include first connected formation portions 10b, first separated formation portions 10d, second connected formation portions 10c, and second separated formation portions 10e. The left end 1b of the first connected formation portion 10b is connected to the first band portion 141. The left end 1b of the first separated formation portion 10d is separated from first band portions 141. The right end 1c of the second connected formation portion 10c is connected to the second band portion 142. The right end 1c of the second separated formation portion 10c is separated from the second band portion 142.

The first separated formation portion 10d is positioned between the two adjacent first connected formation portions 10b. The second separated formation portion 10e is positioned between the two adjacent second connected formation portions 10c. The first connected formation portion 10b may be the second connected formation portion 10c or the second separated formation portion 10e. The first separated formation portion 10d may be the second connected formation portion 10c or the second separated formation portion 10e.

The distance between the two adjacent device formation portions 1a (i.e., the width d1 of the liner groove 421), the distance between the left end of the first separated formation portion 10d and the first band portion 141 (i.e., the width d2 of the second connection groove 423), and the distance between the right end of the second separated formation portion 10e and the second band portion 142 (i.e., the width d3 of the first connection groove 422) are all the same.

The distance between the left end of the first separated formation portion 10d and the first band portion 141 indicates the distance therebetween in the X direction. The distance between the right end of the second separated formation portion 10e and the second band portion 142 indicates the distance therebetween in the X direction.

As shown in FIGS. 1 and 30A, multiple buried wires 23 extend in the Y direction so as to cross the device formation portions 1a in plan view. The buried wires 23 include word lines (first wires) 23A and device isolation wires (second wires) 23B. The word line 23A and the device isolation wire 23B have the same structure, but have different functions.

The word line 23A functions as a gate electrode of a memory cell. The device isolation wire 23B is kept at a predetermined voltage and isolates adjacent elements (transistors) from each other. In other words, the device isolation wire 23B is kept at a predetermined voltage in order to keep a parasitic transistor in the off-state and thereby to isolate adjacent elements in the same device formation region 1a from each other.

Multiple bit lines 30 extend in the X direction that is perpendicular to the Y direction. A memory cell is formed in a region where the word line 23A crosses the device formation region (active region) 1a. Multiple memory cells are formed in the memory cell region 60. Each memory cell is connected to a capacitor (not shown in FIG. 1) through a capacitor contact pad 42. Multiple capacitor contact pads 42 are arranged at a predetermined interval so as not to overlap one another, as shown in FIG. 1. The DRAM of the first embodiment has a $6F^2$ cell structure (F is the minimum feature size).

As shown in FIGS. 2A and 2B, each memory cell forming the DRAM of the first embodiment includes a recessed gate transistor in which the word line 23A, which functions as a gate electrode, is fully buried in the semiconductor substrate 1. The recessed gate transistor includes: a semiconductor substrate 1 having a silicon surface layer; the STI film 8; the device formation portion 1a; the word line 23A filling a bottom portion of a gate electrode groove 13 through a gate insulating film 15; a cap insulating film 22 that covers an upper surface of the word line 23A and has a top level that equals the top level of the semiconductor substrate 1; and a bit line 30 over a first inter-layer insulating film 24 covering the upper surface of the semiconductor substrate 1.

The recessed gate transistor further includes diffusion regions 25 and 37 that are formed by introducing an impurity into two surface regions of the device formation portion 1a, which are positioned on both sides of the word line 23A. The diffusion region 25 is connected to the bit line 30.

As shown in FIG. 2A, part of the buried wire 23 is buried in the device formation portion 1a between two adjacent STI films 8 that are arranged in a longitudinal direction of the buried wire 23. A silicon thin film 14 having a sidewall shape is formed between the STI film 8 and the buried bottom portion of the buried wire 23.

The word line 23A and the device isolation wire 23B have the same structure. For this reason, the silicon thin films 14 are similarly formed between a buried bottom portion of the word line 23A and the STI film 8 and between a buried bottom portion of the word line 23B and the STI film 8. The silicon thin film 14 functions as a channel when the voltage difference between the source region and the drain region exceeds a threshold. Therefore, the recessed gate transistor of the first embodiment is a recessed channel transistor including the channel region such as the silicon thin film 14.

A capacitor is formed over the recessed gate transistor through an insulating film 33. Specifically, a capacitor contact pad 42 is formed over the insulating film 33. The capacitor contact pad 42 is electrically connected to the diffusion region 37 of the recessed gate transistor through a capacitor contact plug 41. A capacitor is formed over the capacitor contract pad 42 so as to penetrate a stopper film 43 and a third inter-layer insulating film 44. The capacitor includes a lower electrode 46, a capacitor insulating film 47 covering the lower electrode 46, and an upper electrode 48 covering the capacitor insulating film 47.

Although it is explained in the first embodiment that the capacitor of the first embodiment has a cylindrical shape such that an inner surface of the lower electrode 46 is used as an electrode, the shape of the capacitor is not limited thereto. For example, the capacitor may have a crown shape such that inner and outer surfaces of the lower electrode are used as an electrode.

A fourth inter-layer insulating film 49 is formed over the capacitor. A wiring layer, which includes an upper metal wire 50 and a protection film 51 covering the upper metal wire 50, is formed over the fourth inter-layer insulating film 49. Although it is explained in the first embodiment that the wiring layer has a single-layered wiring structure, the wiring layer is not limited thereto. For example, the wiring layer may have a multi-layered wiring structure including multiple wiring layers and inter-layer insulating films.

Hereinafter, a method of manufacturing the semiconductor device (DRAM shown in FIGS. 1, 2A and 2B) according to the first embodiment is explained. FIGS. 3A to 26 illustrate a process flow indicative of the DRAM manufacturing method of the first embodiment. FIGS. 3A to 25A are cross-sectional views taken along the line A-A' shown in FIG. 1. FIGS. 3B to 25B are cross-sectional views taken along the line B-B' shown in FIG. 1.

The DRAM manufacturing method of the first embodiment includes: a process of forming the STI film 8; a process of forming the buried wire 23; a process of forming the bit line 30; a process of forming the capacitor contact plug 41; a process of forming the capacitor; and a process of forming the wiring layer. Hereinafter, each process is explained in detail.

In the process of forming the STI film 8, the device isolation groove 4 is formed in the semiconductor substrate 1. Firstly, a silicon oxide ($SiO_2$) film 2 is formed over the semiconductor substrate 1 that is made of p-type silicon. Then, a silicon nitride film ($Si_3N_4$) 3 is formed over the silicon oxide film 2. Then, a stack of the semiconductor substrate 1, the silicon oxide film 2 and the silicon nitride film 3 is patterned by photolithography and dry-etching processes.

Thus, the device isolation groove 4 is formed as shown in FIGS. 3A and 3B. As explained above with reference to FIG. 30A, the element formation groove 4 includes the linear grooves 421, the first connection grooves 422, and the second connection grooves 423. The linear grooves 421 extend in a direction crossing the Y direction. Each first connection groove 422 connects right end portions of a pair of adjacent linear grooves 421 in the Y direction, so that the second separated formation portion 10e is formed. Each second connection groove 423 connects left end portions of a pair of adjacent linear grooves 421 in the Y direction, so that the first separated formation portion 10d is formed.

Specifically, when sequential first to four linear grooves 421 extend in parallel as shown in FIG. 30A, right end portions of the first and second linear grooves 421 are connected by one of the first connection grooves 422. Additionally, left end portions of the second and third linear grooves 421 are connected by one of the second connection grooves 423. Further, right end portions of the third and fourth linear grooves 421 are connected by another one of the first connection grooves 422.

Thus, the first connection groove 422 does not connect all the right end portions of the linear grooves 421. The second connection groove 423 does not connect all the left end portions of the linear grooves 421. The first connection grooves 422, the second connection grooves 423, and the linear grooves 421 are connected in a zig-zag manner.

Figure 31A:
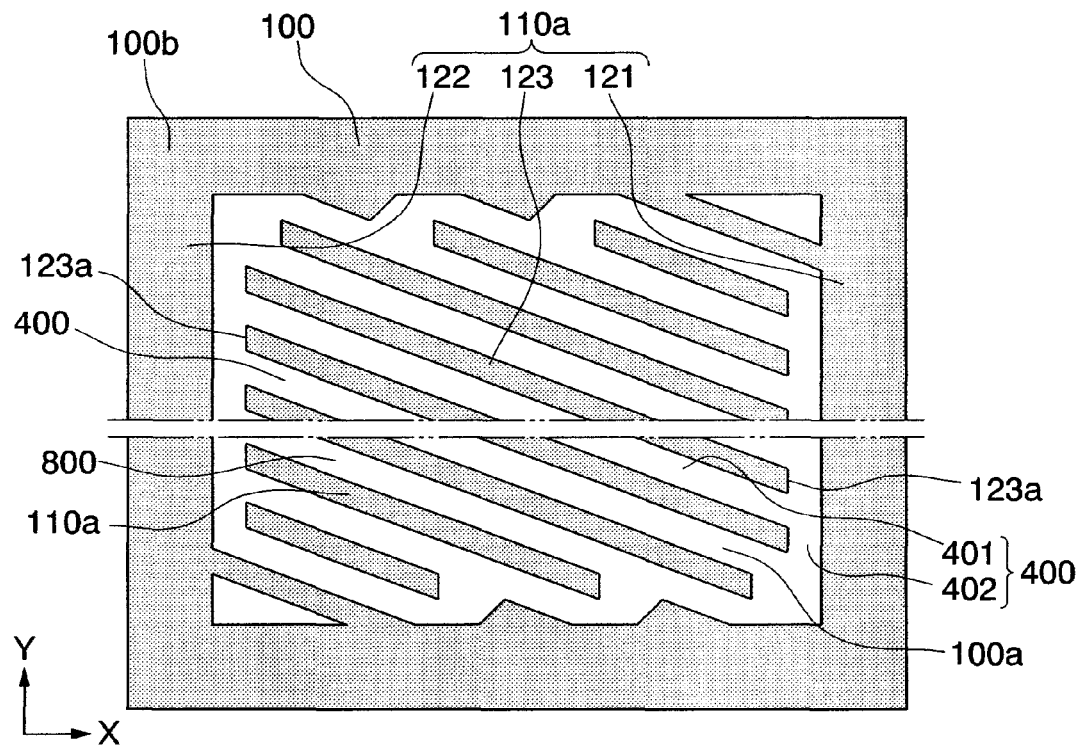
FIG. 31A is a plan view illustrating one of processes included in a method of forming a semiconductor memory device (DRAM) according to a related art.
Figure 31B:
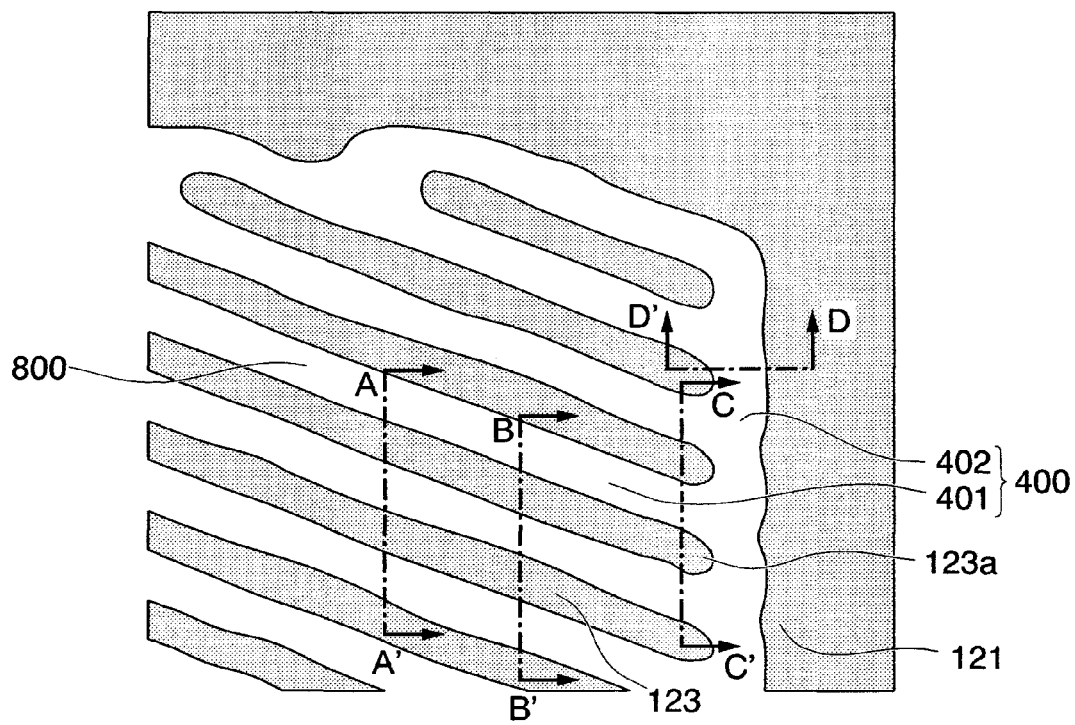
FIG. 31B is an enlarged plan view illustrating part of a device formation region shown in FIG. 31A.
Figure 32A:
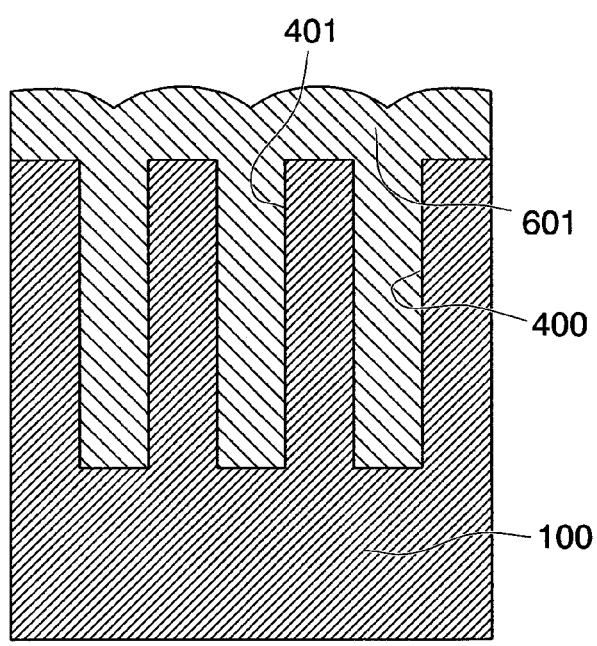
FIGS. 32A, 32B, 33A to 33D, 34A and 34B are cross-sectional views illustrating a process of forming an STI film of the DRAM shown in FIGS. 31A and 31B.
Figure 32B:
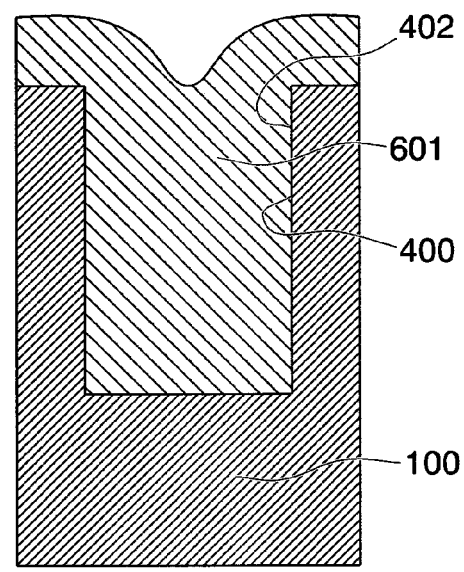
Figure 32C:
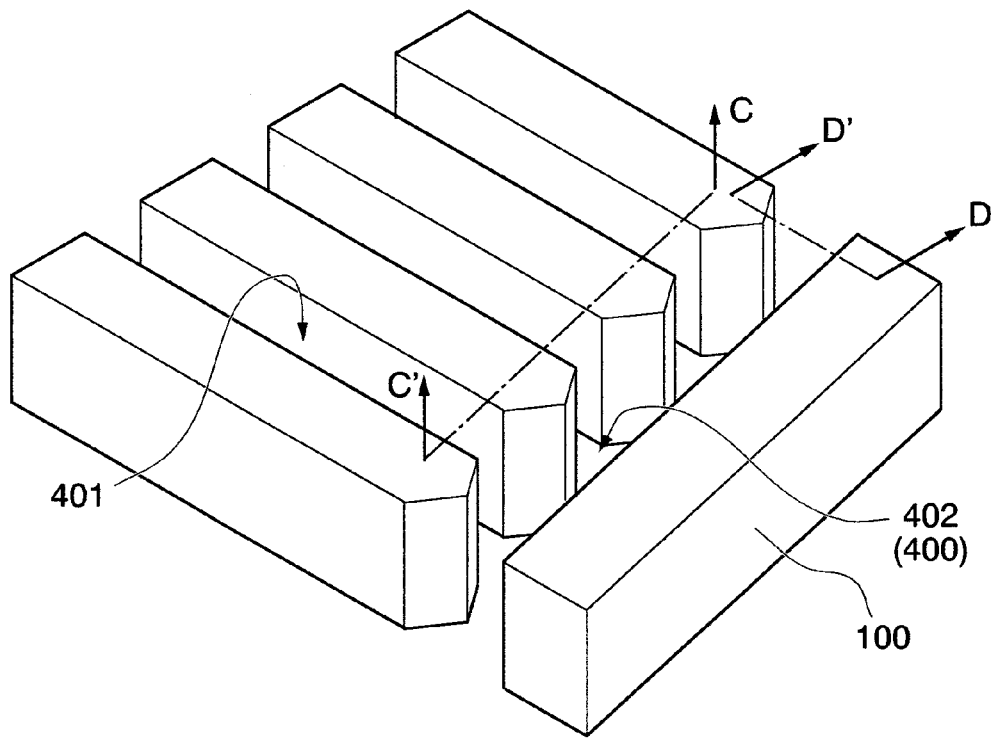
FIG. 32C is a perspective view illustrating the process.
Figure 33A:
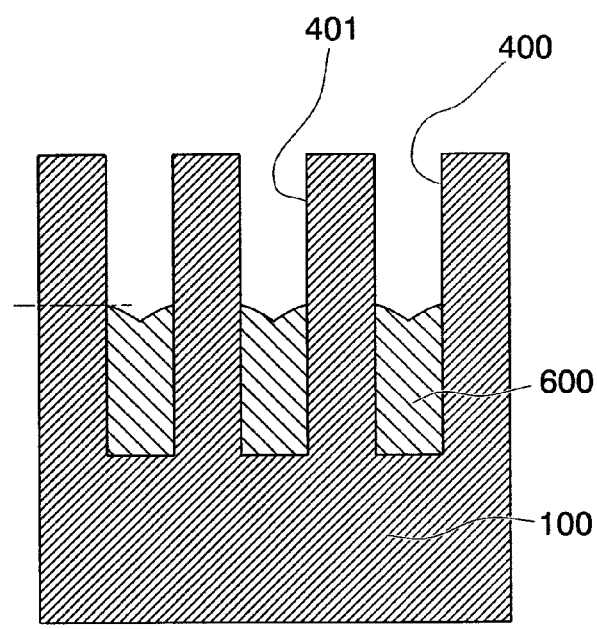
Figure 33B:
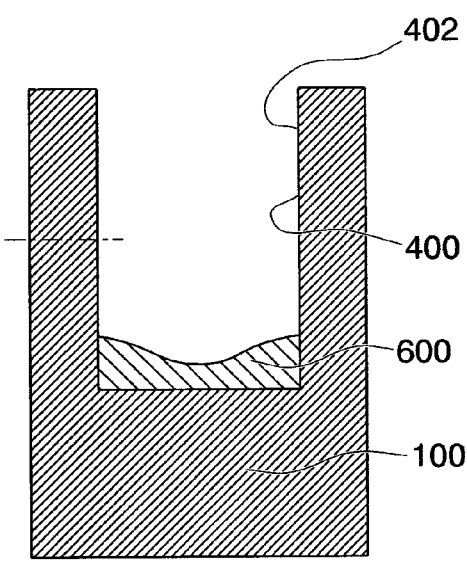
Figure 33C:
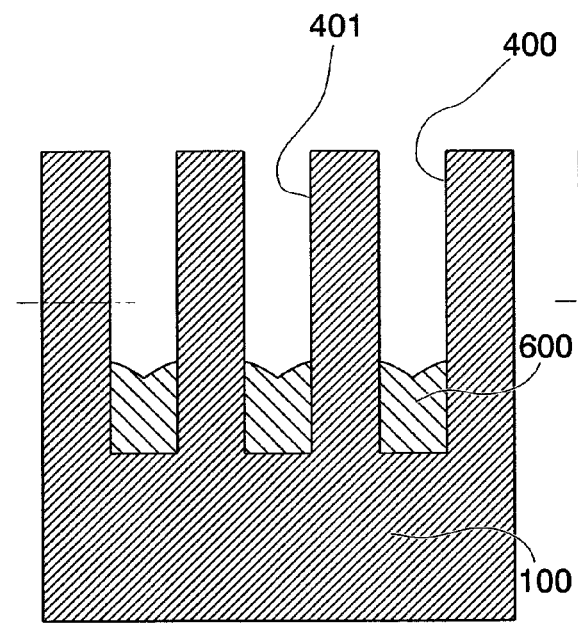
Figure 33D:
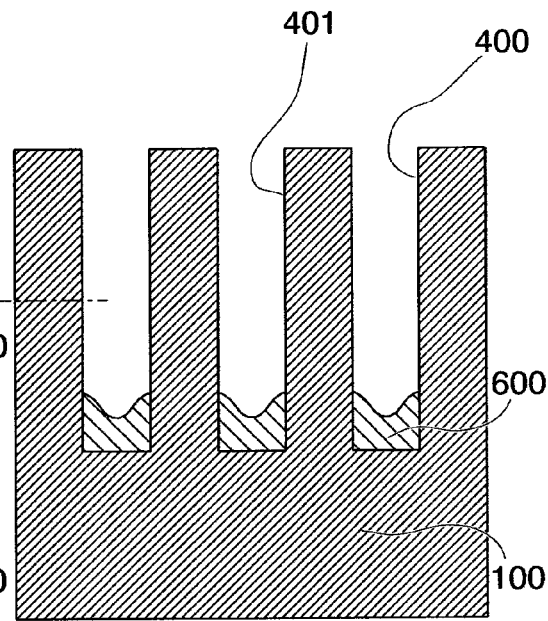
Figure 34A:
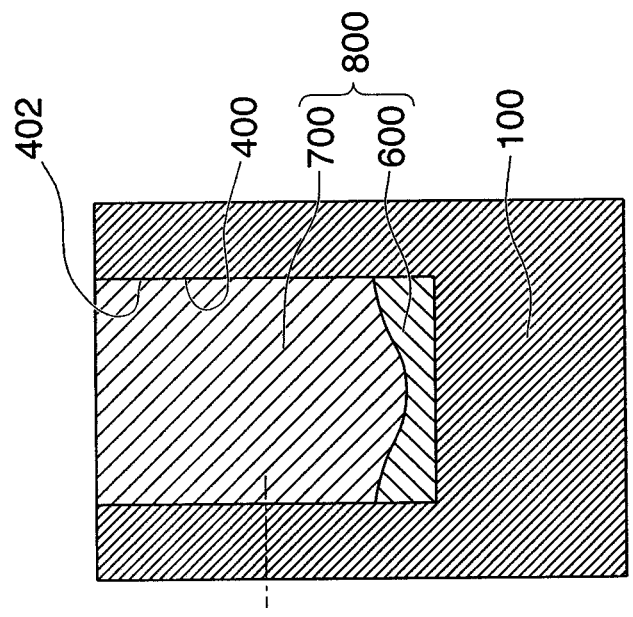
Figure 34B:
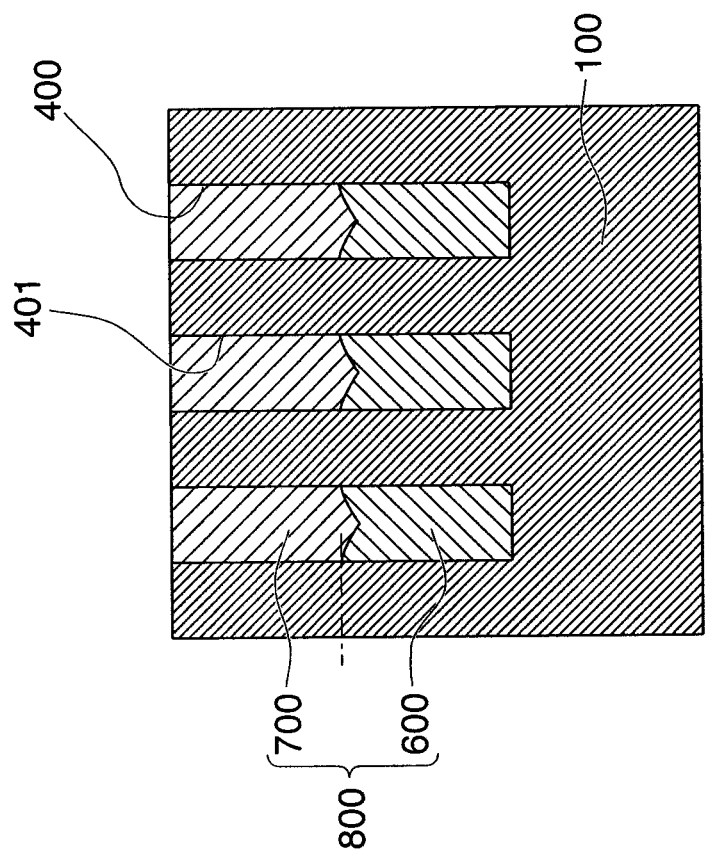
Figure 35A:
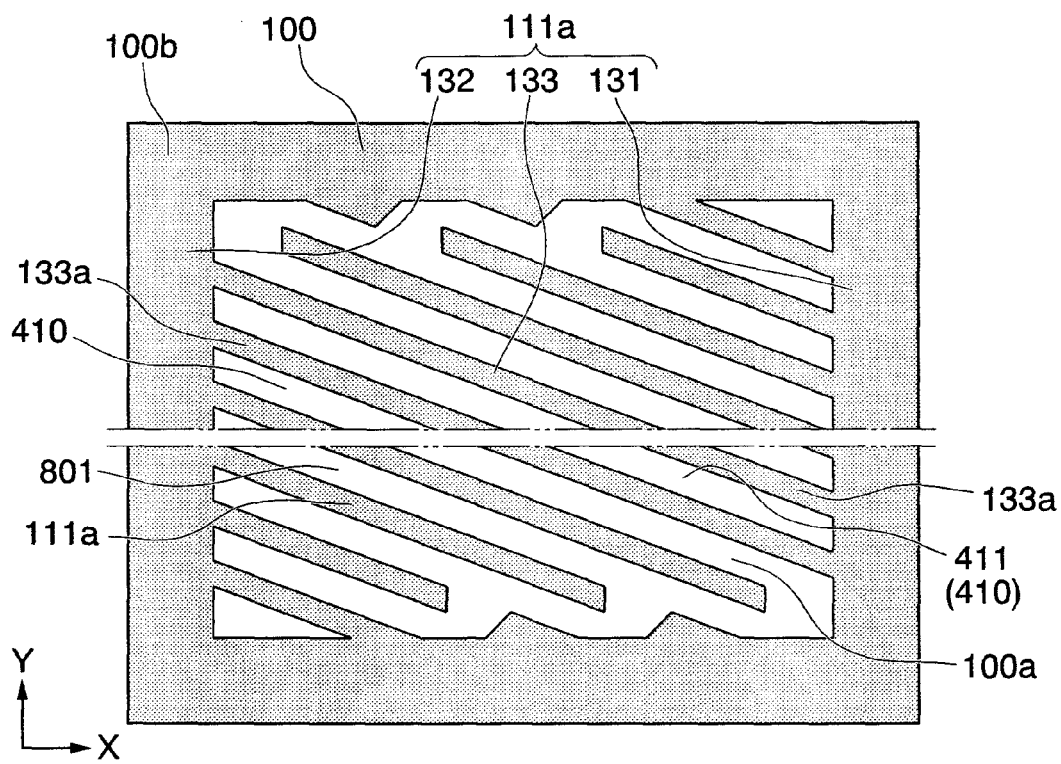
FIG. 35A is a plan view illustrating one of processes included in a method of forming another semiconductor memory device (DRAM) according to the related art.
Figure 35B:
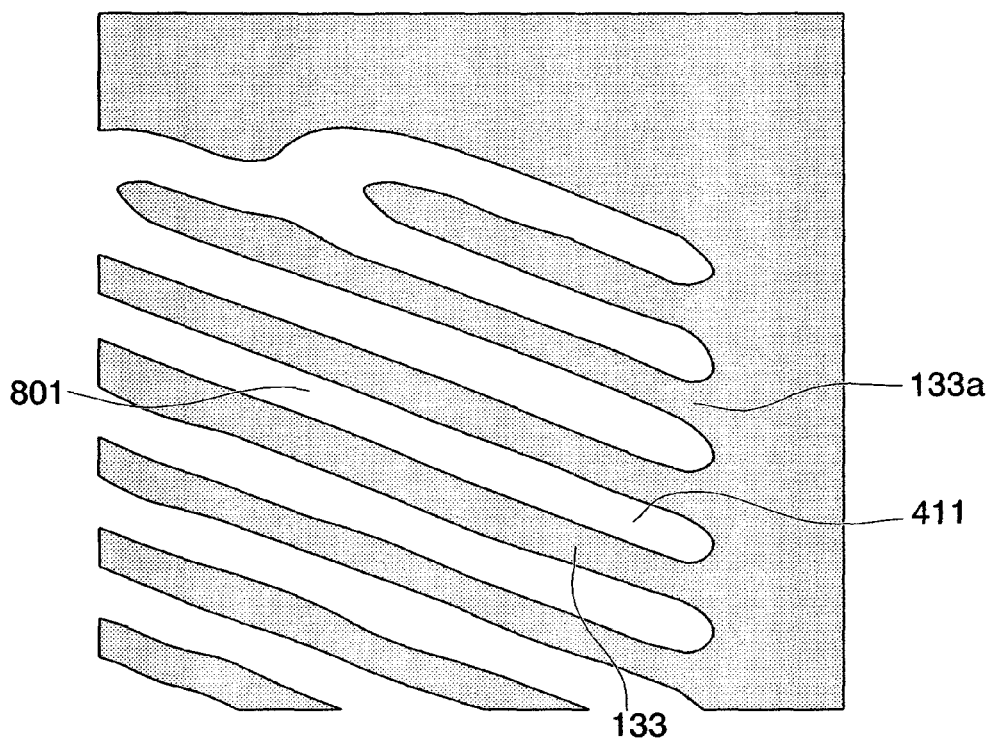
FIG. 35B is an enlarged view illustrating part of a memory cell region shown in FIG. 35A.

Accordingly, there occurs no case where the end portion of the linear groove 421 is wider than the center portion thereof, such as the case of FIGS. 31A and 31B where all the end portions of the linear grooves 401 are connected by the connection groove 402. Further, there occurs no case where the end portion of the linear groove 421 is narrower than the center portion thereof, such as the case of FIGS. 35A and 35B. Accordingly, the planar shape of the device isolation groove 4 has a smaller variation in width, and therefore has a smaller variation in the aspect ratio than those in the cases of FIGS. 31A, 31B, 35A, and 35B.

When the device isolation groove 4 is formed, the stack of the silicon nitride film 3, the silicon oxide film 2, and the semiconductor substrate 1 is patterned such that the width d1 of the linear groove 421, the width d2 of the second connection groove 423, and the width d3 of the first connection groove 422 become all the same, as shown in FIG. 30A. Accordingly, the device isolation groove 4 of the first embodiment has a very small variation in the width and a very small variation in the aspect ratio.

Figure 4B:
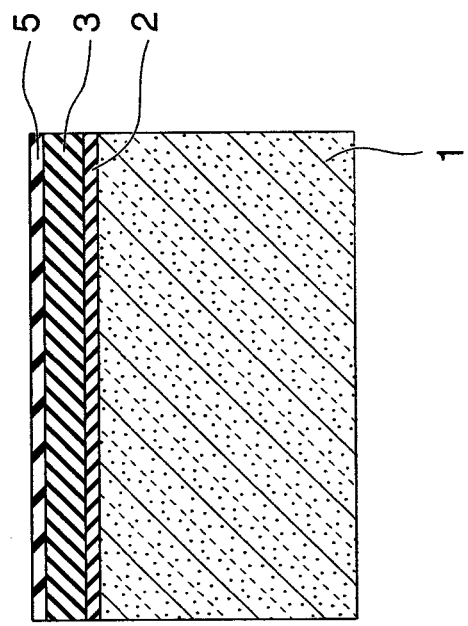
Figure 4A:
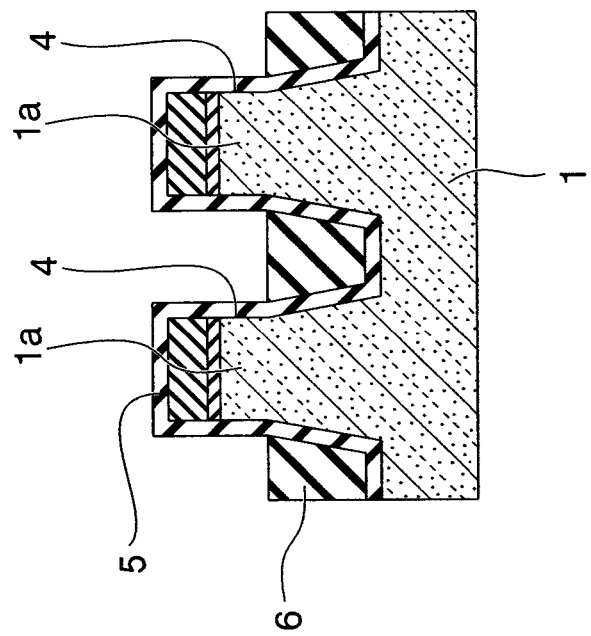

After the patterning process, an insulating film is formed so as to fill the device isolation groove 4. Thus, the STI film 8 and the device formation region 10a defined by the STI film 8 are formed. Specifically, a silicon oxide film 5 is formed by a thermal oxidation process so as to cover an inner surface of the device isolation groove 4, and an upper surface of the silicon nitride film 3 covering the device formation region 10a of the semiconductor substrate 1, as shown in FIGS. 4A and 4B.

Then, a silicon nitride film is formed to fill the device isolation groove 4. In this case, the device isolation groove 4 has a very small variation in the width and in the aspect ratio. Therefore, the silicon nitride film can uniformly fill the entire device isolation groove 4 without difficulty, thereby preventing defective formation of the silicon nitride film.

Then, the silicon nitride film filling the device isolation groove 4 is partially removed by a wet-etching process with an etchant, such as hydrofluoric acid. Thus, a silicon nitride film 6 remains in a bottom portion of the device isolation groove 4, as shown in FIG. 4A.

As explained above, in the manufacturing method of the first embodiment, the device isolation groove 4 has a very small variation in width. For this reason, the etchant for etching the silicon nitride film 6 hardly invades from a wide portion of the device isolation groove 4 to a narrow portion of the device isolation groove 4. Accordingly, a variation in the top level of the silicon nitride film 6 is reduced. Consequently, a variation in the aspect ratio of the device isolation groove 4 after the silicon nitride film 6 is formed is reduced.

Figure 5A:
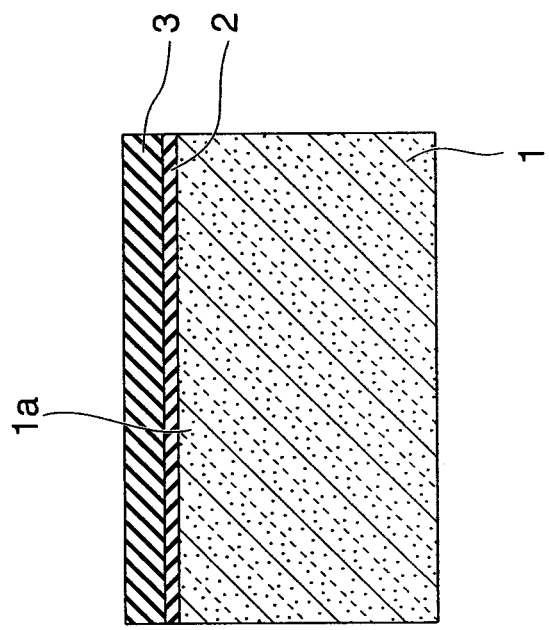
Figure 5B:
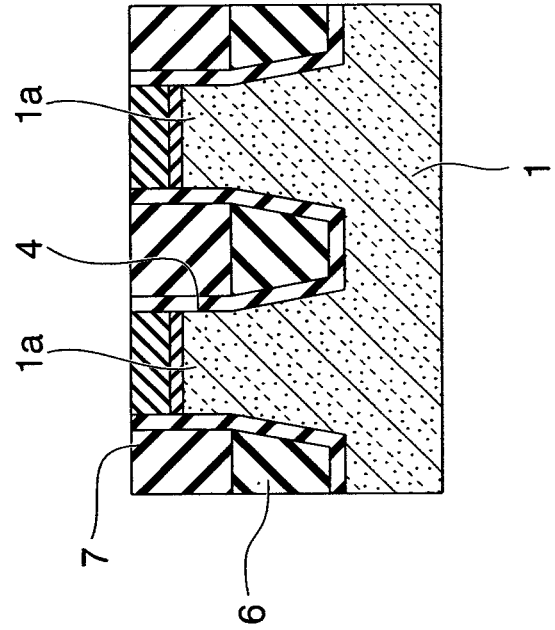

After the silicon nitride film 6 is formed, a silicon oxide film, which fills the device isolation groove 4, is formed by a CVD (Chemical Vapor Deposition) over the silicon nitride film 6, as shown in FIGS. 5A and 5B. As explained above, variations in the width and in the aspect ratio of the device isolation groove 4 are reduced. Accordingly, the silicon oxide film can uniformly fill the entire device isolation groove 4 without difficulty.

Then, a CMP (Chemical Mechanical Polishing) process is carried out until the silicon nitride film 3 as a mask is exposed. Thus, a silicon oxide film (second insulating film) 7 is formed. Then, the silicon nitride film 3 and the silicon oxide film 2 as masks are removed by a wet-etching process so that the top level of the device isolation groove 4 (i.e., the level of the upper surface of the silicon oxide film 7) equals the top level of the semiconductor substrate 1, as shown in FIGS. 6A and 6B. Thus, the STI film 8 is formed, and the device formation region 10a is defined by the STI film 8.

Then, an impurity diffusion layer is formed in a surface region of the semiconductor substrate 1. Specifically, a silicon oxide film 9 is formed over the semiconductor substrate 1 and the silicon oxide film 7 by thermal oxidation, as shown in FIGS. 6A and 6B. Then, an n-type impurity (such as phosphorus) is ion-implanted into the device formation portion 1a of the semiconductor substrate 1 using the silicon oxide film 9 as a mask. Thus, an n-type impurity diffusion layer 10 is formed in a surface region of the semiconductor substrate 1. The n-type impurity diffusion layer 10 functions as part of source and/or drain regions of the transistor.

Figure 7B:
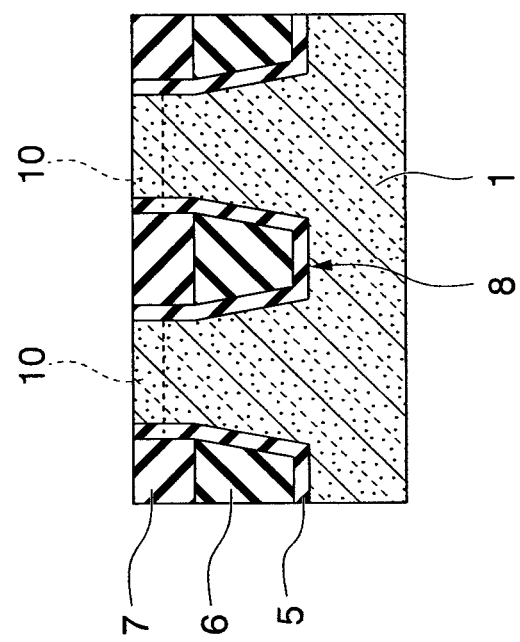
Figure 7A:
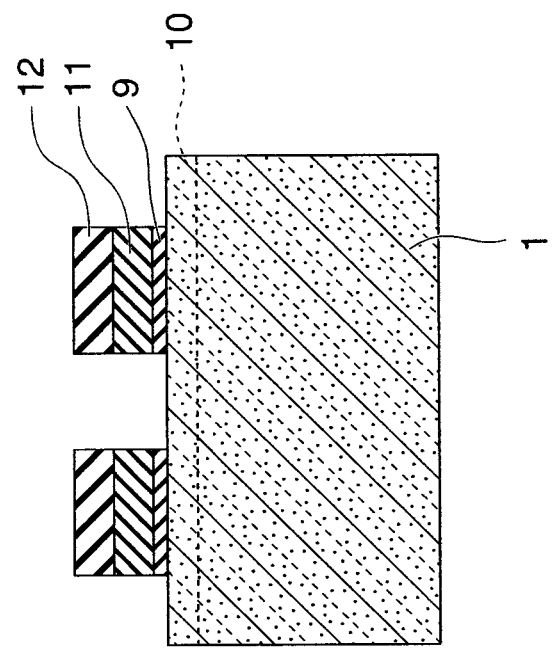

In the process of forming the buried wire 23, a silicon nitride film 11 and a carbon film (amorphous carbon film) 12, which serve as masks, are formed over the silicon oxide film 9 in this order, as shown in FIGS. 7A and 7B. Then, a stack of the carbon film 12, the silicon nitride film 11, and the silicon oxide film 9 is patterned to form a hard mask for forming a gate electrode trench.

Figure 8B:
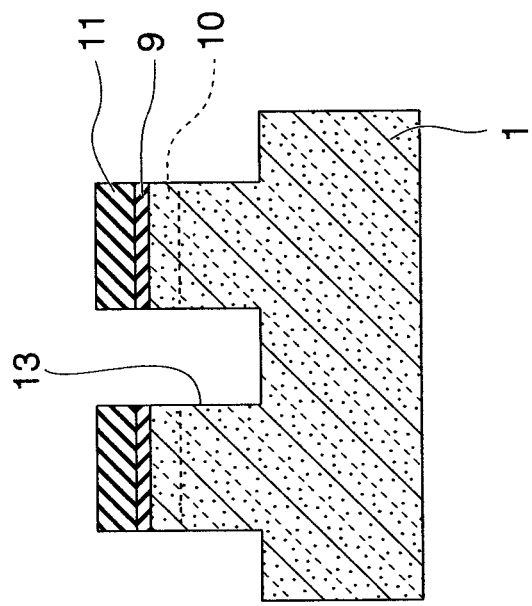
Figure 8A:
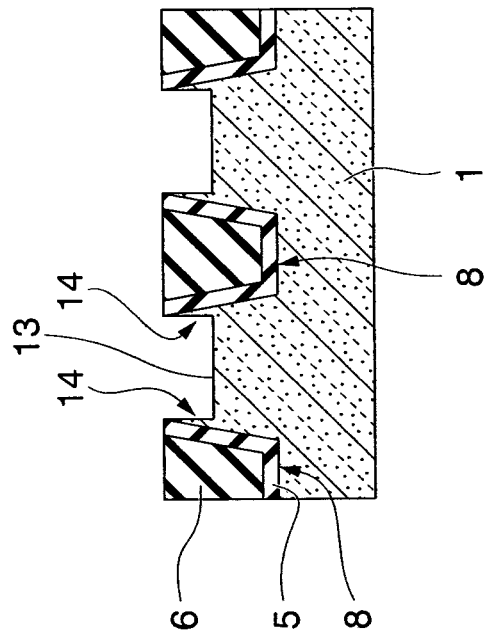

Then, the semiconductor substrate 1 is dry-etched using the hard mask, as shown in FIGS. 8A and 8B. Thus, a gate electrode trench 13 is formed. The gate electrode trench 13 is a line pattern extending in a direction crossing the device formation portion 1a (for example, the Y direction shown in FIG. 1).

In this case, the exposed surface of the semiconductor substrate 1 is etched so that the top level of the STI film 8 becomes higher than the top level of the etched surface of the semiconductor substrate 1, as shown in FIG. 8A. Thereby, a silicon thin film 14, which has a sidewall shape, remains between either side surface of the gate electrode trench 13 and the STI film 8. The silicon thin film 14 functions as a channel region of the transistor.

As shown in FIG. 8A, the silicon oxide film 7 filling the upper region of the device isolation groove 4 is also removed by etching the semiconductor substrate 1 to form the gate electrode trench 13. The silicon oxide film 7 is present only in a region of the device isolation groove 4 where the buried wire 23 shown in FIG. 1 is formed. Therefore, the silicon oxide film 7 remains in a region of the device isolation groove 4 where the buried wire 23 is not formed, which is the region of the device isolation groove 4 between adjacent buried wires 23.

If defectives, such as voids, are included in the silicon oxide film 7 in the region of the device isolation groove 4 between adjacent buried wires 23, the defectives occasionally cause short circuit between adjacent buried wires 23. Further, if defectives, such as voids, are included in the silicon oxide film 7 that remains after the semiconductor substrate 1 is etched, the defectives occasionally cause short circuit of the bit line 30 and the capacitor contact plug 41, formation of defective patterns, and the like.

After the formation of the gate electrode trench 13, the gate insulating film 15 is formed so as to cover an inner surface of the gate electrode trench 13 and the upper surface of the semiconductor substrate 1, as shown in FIGS. 9A and 9B. A silicon oxide film formed by thermal oxidation, and the like are used as the gate insulating film 15. Then, gate electrode materials are deposited over the gate insulating film 15 so as to fill the gate electrode trench 13. Specifically, titanium nitride (TiN) and tungsten (W) are used as the gate electrode materials. A titanium nitride film 16 and a tungsten film 17 are formed so as to fill the gate electrode trench 13.

Figure 10A:
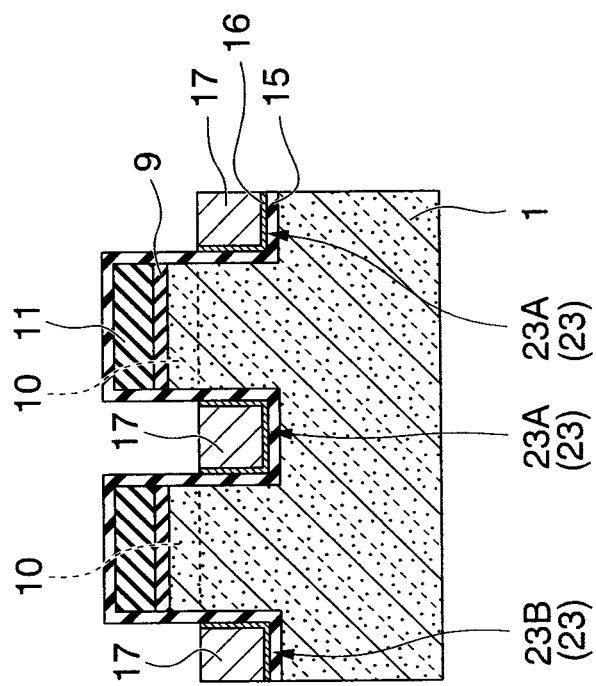
Figure 10B:
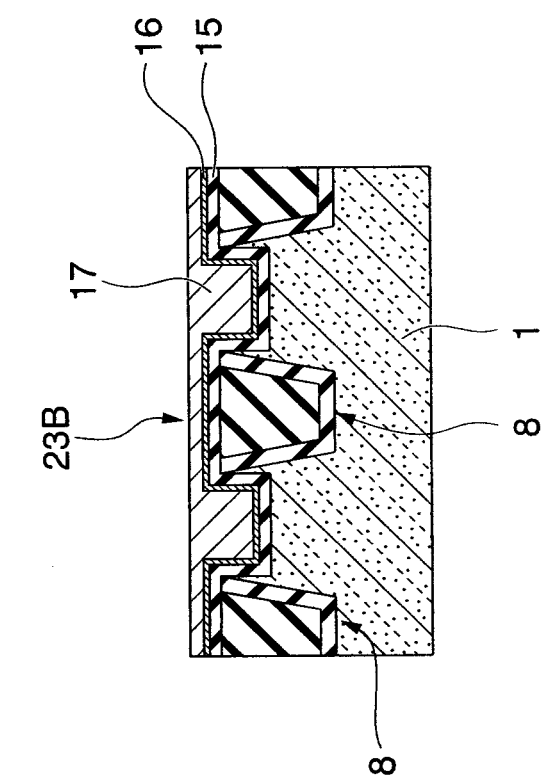

Then, the titanium nitride film 16 and the tungsten film 17, which fills the gate electrode trench 13, are etched so that the remaining portions of the titanium nitride film 16 and the tungsten film 17 fill only a bottom portion of the gate electrode trench 13, as shown in FIGS. 10A and 10B. Thus, the buried wires 23, which are word lines (gate electrode) 23A and device isolation wires 23B, are formed in the gate electrode trench 13. The amount of the above etching process is adjusted so that the top level of the tungsten film 17 becomes lower than the top level of the semiconductor substrate 1.

Figure 11B:
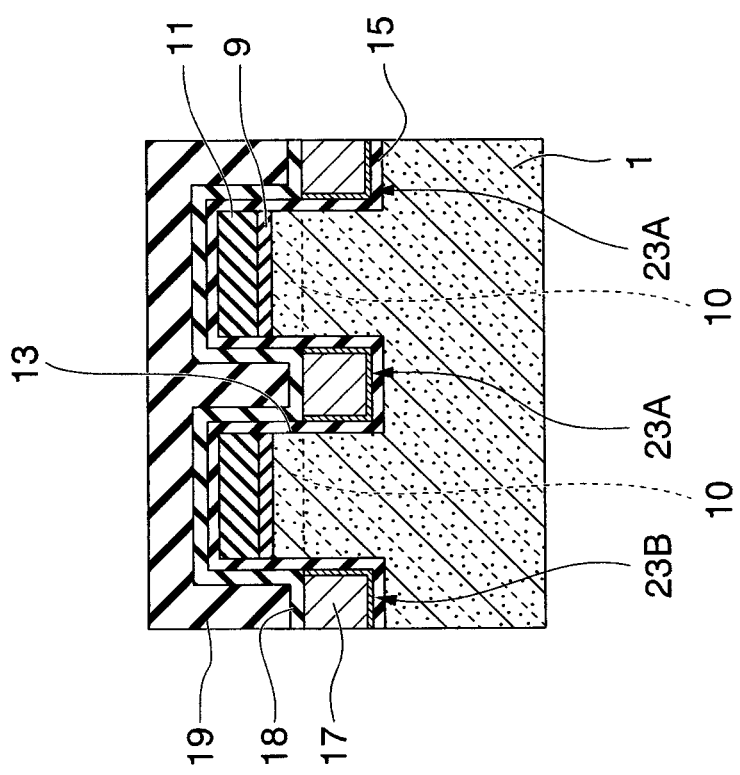
Figure 11A:
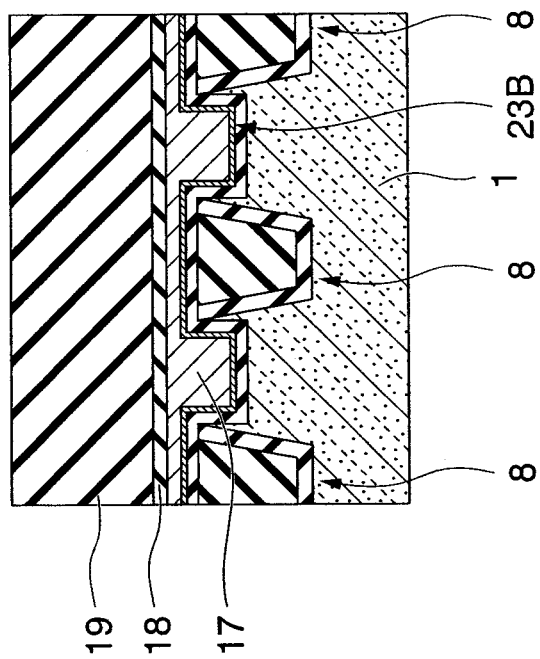

Then, a liner film 18 is formed so as to cover the remaining tungsten film 7 and the exposed inner surface of the gate electrode trench 13, as shown in FIGS. 11A and 11B. The liner film 18 is made of a silicon nitride film, or the like. Then, a buried insulating film 19 is formed over the liner film 18. As the buried insulating film 19, a silicon oxide film formed by a CVD method, an SOD film that is a coating film, a multi-layered film including these films, or the like may be used. When an SOD film is used as the buried insulating film 19, the SOD film is formed over the liner film 18, and then an annealing process is carried out under a water-vapor atmosphere at a high temperature to solidify the SOD film.

Then, the surface of the semiconductor substrate 1 is planarized by a CMP process until the liner film 18 is exposed. Then, the silicon nitride film 11 as a mask, part of the buried insulating film 19 and the liner film 18 are etched to expose the silicon surface of the semiconductor substrate 1, as shown in FIGS. 12A and 12B. Thus, the cap insulating film 22, which includes the liner film 18 and the buried insulating film 19, is formed over the buried wires 23.

In the process of forming the bit lines 30, a first inter-layer insulating film 24 is formed so as to cover the surfaces of the semiconductor substrate 1 and the cap insulating film 22, as shown in FIGS. 13A and 13B. The first inter-layer insulating film 24 includes an HDP (High Density Plasma) film and the like. The first inter-layer insulating film 24 fills the gap between the top surface of the semiconductor substrate 1 and the top surface of the cap insulating film 22. The first inter-layer insulating film 24 has a flat upper surface.

Then, part of the first inter-layer insulating film 24 is removed by photolithography and dry-etching processes to form a bit contact hole 24a, as shown in FIGS. 14A and 14B. As shown in FIG. 1, the bit contact hole 24a is formed as a line pattern 24b extending in parallel with the buried wires 23 (i.e., in the Y direction shown in FIG. 1). At a portion where the bit contact pattern 24b and the device formation portion 1a cross each other, the silicon surface of the semiconductor substrate 1 is exposed to the bit contact hole 24a, as shown in FIG. 14B.

Then, an n-type impurity, such as arsenic, is ion-implanted into the exposed surface of the semiconductor substrate 1 using the first inter-layer insulating film 24 as a mask, as shown in FIGS. 14A and 14B. Thus, an n-type impurity diffusion layer is formed in a surface region of the semiconductor substrate 1. The n-type impurity diffusion layer becomes the diffusion region 25 that functions as a source or drain region (drain region in the first embodiment) of the transistor. Preferably, the dose amount for forming the diffusion region 25 is larger than that for forming the aforementioned n-type impurity diffusion layer 10 to form a LDD (Lightly Doped Drain) structure.

Then, a poly-silicon film 26 containing an n-type impurity, such as phosphorus, is formed over the first inter-layer insulating film 24, as shown in FIGS. 15A and 15B. Then, a tungsten silicide film 27, a tungsten film 28, and a silicon nitride film 29 are formed over the poly-silicon film 26 in this order.

Then, a stack of the poly-silicon film 26, the tungsten silicide film 27, the tungsten film 28, and the silicon nitride film 29 is patterned to form the bit lines 30, as shown in FIGS. 16A and 16B. The bit line 30 is electrically connected, through the bit contact hole 24a, to the diffusion region 25 that becomes a source or drain region. In other words, the poly-silicon film 26 forming the bit line 30 is electrically connected to the diffusion region 25 formed in the surface region of the semiconductor substrate 1, which is exposed to the bit contact hole 24a. Thus, the bit line 30 of the first embodiment has a function of a contact plug electrically connected to the diffusion region 25 that becomes a source or drain region. In the manufacturing method of the first embodiment, the bit lines 30 that have functions of contact plugs are collectively formed by one lithography process.

The bit lines 30 are formed as a pattern extending in a direction crossing the buried wires 23 (i.e., in the X direction shown in FIG. 1). Although it has been explained in the first embodiment that the bit lines 30 have a straight line shape and are perpendicular to the buried wires 23, the present invention is not limited thereto. For example, the bit line 30 may has a partially-curved shape.

Then, a silicon nitride film 31 is formed over the first inter-layer insulating film 24 so as to cover the bit lines 30, as shown in FIGS. 17A and 17B. Then, a liner film 32 is formed so as to cover the silicon nitride film 31. A silicon nitride ($Si_3N_4$) film, a silicon oxynitride (SiON) film, or the like may be used as the liner film 32.

The DRAM of the first embodiment includes a peripheral circuit (not shown) in the peripheral region 60a outside the memory cell region 60. When a planar MOS transistor is formed as the peripheral circuit, a gate electrode of the planar MOS transistor and the bit line 30 can be formed simultaneously. The multi-layered film including the silicon nitride film 31 and the liner film 32 can be used as part of a sidewall of the gate electrode of the planar MOS transistor.

In the process of forming the capacitor contact plug 41, an SOD film (insulating film) 33 is formed over the liner film 32 so as to fill spaces among the bit lines 30. Then, an annealing process is carried out under a water-vapor atmosphere to solidify the liner film 32, as shown in FIGS. 18A and 18B.

Then, a CMP process is carried out until an upper surface of the liner film 32 is exposed. Then, a second inter-layer insulating film 34 is formed so as to cover the upper surfaces of the SOD film 33 and the liner film 32. A silicon oxide film, which is formed by a CVD method, may be used as the second inter-layer insulating film 34.

Figure 19A:
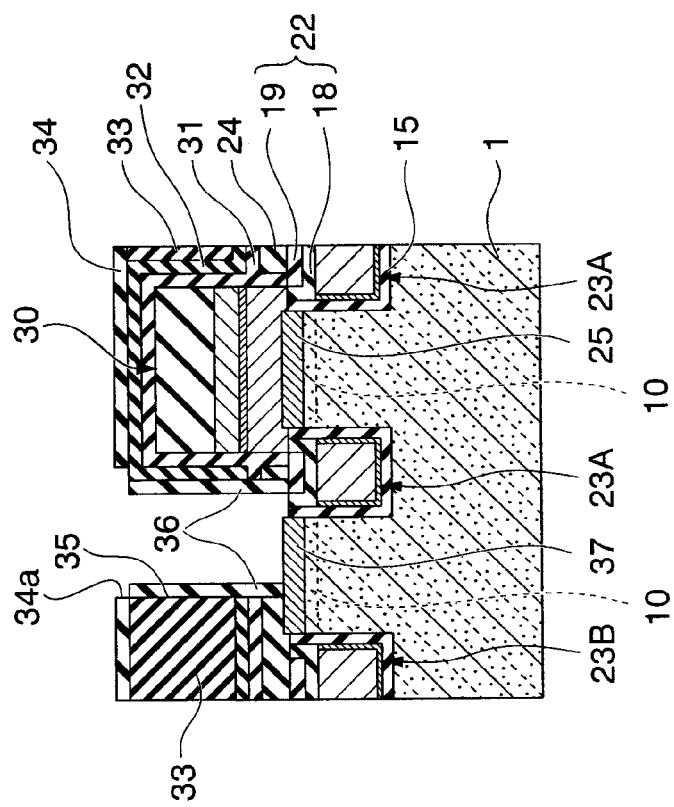
Figure 19B:
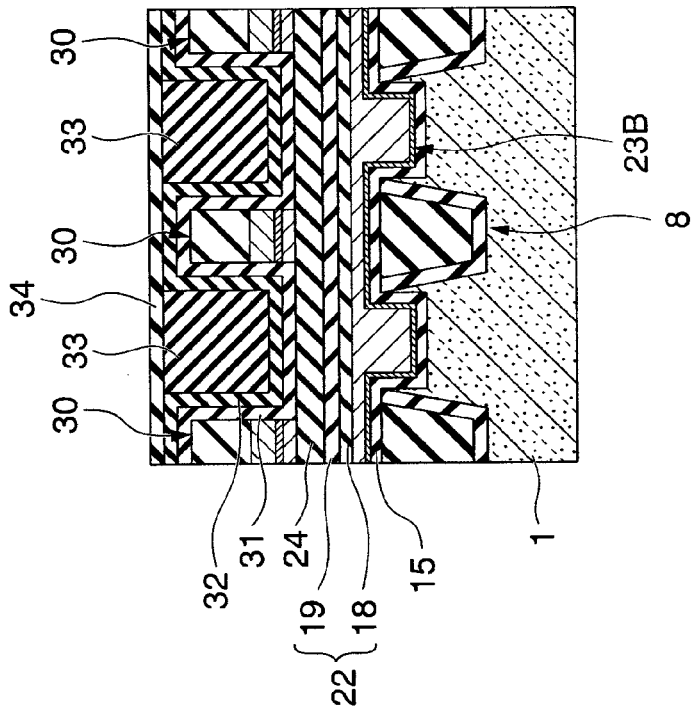

Then, a capacitor contact hole 35 is formed by photolithography and dry-etching processes, as shown in FIGS. 19A and 19B. An SAC (Self Alignment Contact) method using the silicon nitride film 31 and the liner film 32 as sidewalls is used to form the capacitor contact hole 35.

Figure 26:
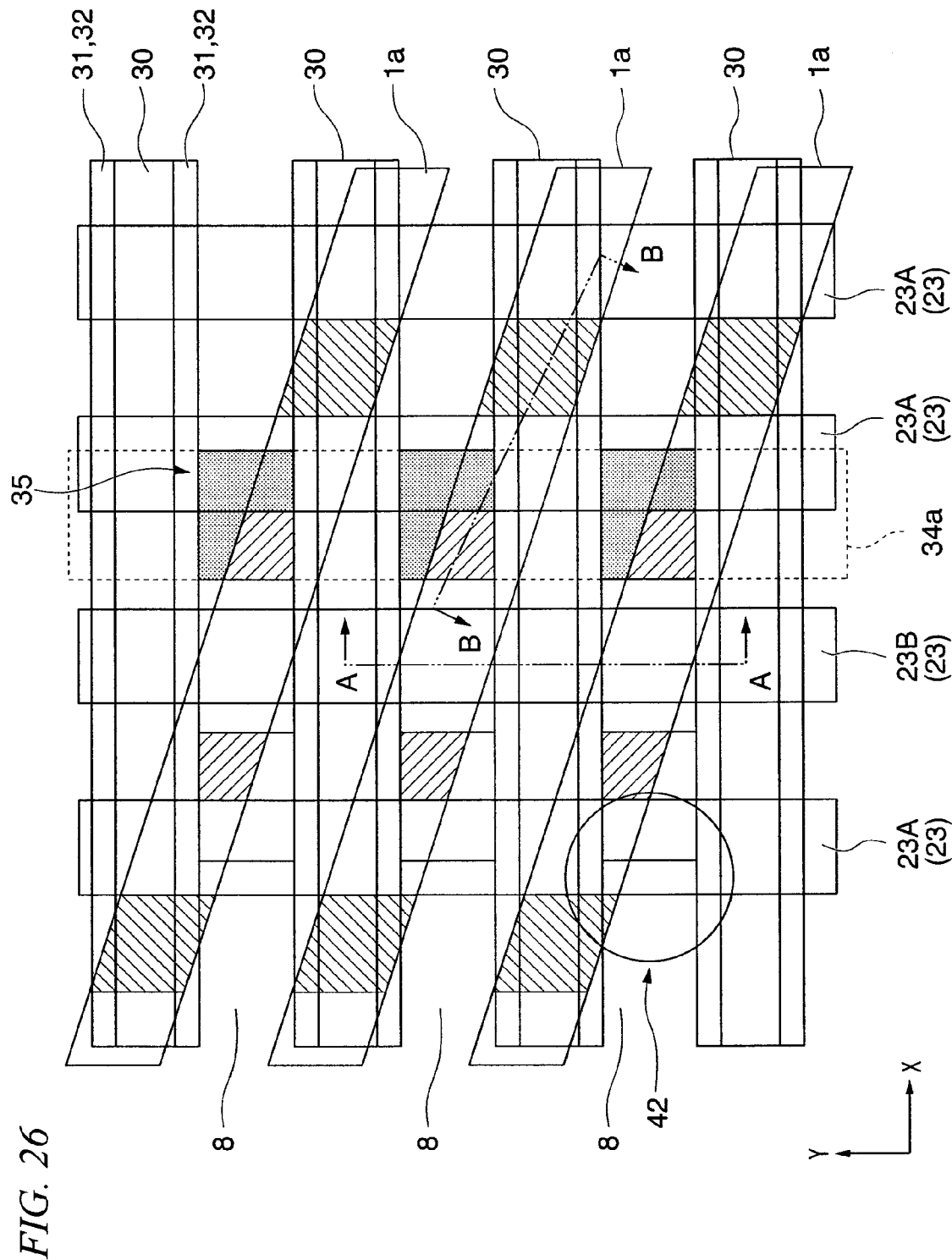
FIG. 26 is a plan view illustrating a process included in the process flow according to the first embodiment.

Specifically, a line-shaped opening pattern 34a, which extends in parallel with the buried wires 23 (in the Y direction shown in FIG. 26), is formed in the second inter-layer insulating film 34, as shown in FIG. 26. When the SOD film 33 and the second inter-layer insulating film 34 are dry-etched simultaneously, a hole is formed in the SOD film 33 by self-alignment while the width of hole is defined by the silicon nitride film 31 and the liner film 32 which cover sidewalls of the bit line 30. Then, the liner film 32, the silicon nitride film 31, and the first inter-layer insulating film 24, which are exposed to the hole, are sequentially etched. Thus, the capacitor contact hole 35 is formed.

As shown in FIG. 26, at a portion where the capacitor contact hole 35 overlaps the device formation portion 1a in plan view, the silicon surface of the semiconductor substrate 1 is partially exposed to the capacitor contact hole 35.

Then, a sidewall 36 is formed so as to cover a side surface of the capacitor contact hole 35, as shown in FIGS. 19A and 19B. The sidewall 36 is made of a silicon nitride film or the like. Then, an n-type impurity, such as phosphorus, is ion-implanted into a surface region of the semiconductor substrate 1, which is exposed to the capacitor contact hole 35. Thus, an n-type impurity diffusion layer is formed in the surface region of the semiconductor substrate 1. The n-type impurity diffusion layer becomes the diffusion region 37 that functions a source or drain region of the transistor (source region in the first embodiment).

Figure 20B:
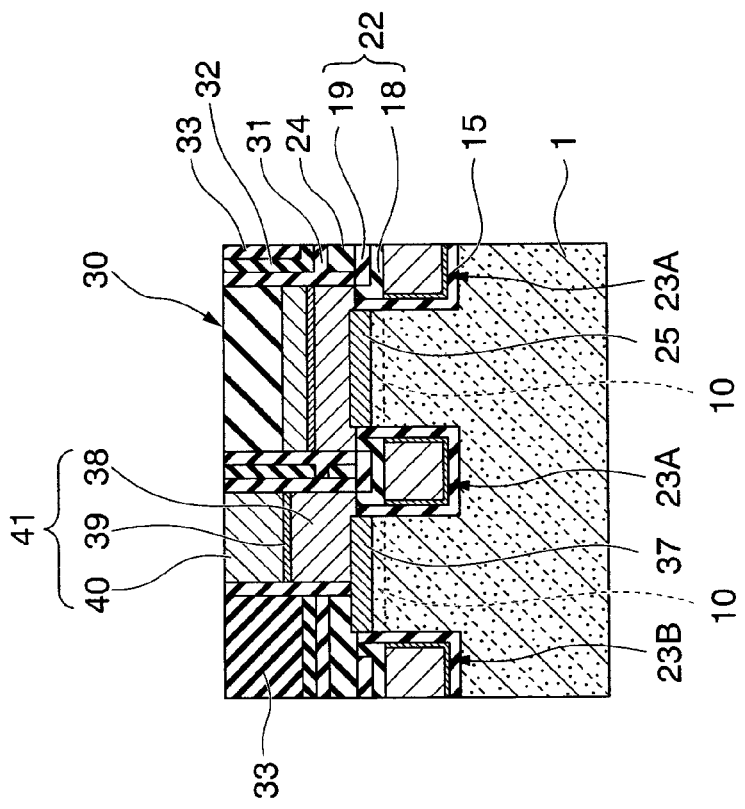
Figure 20A:
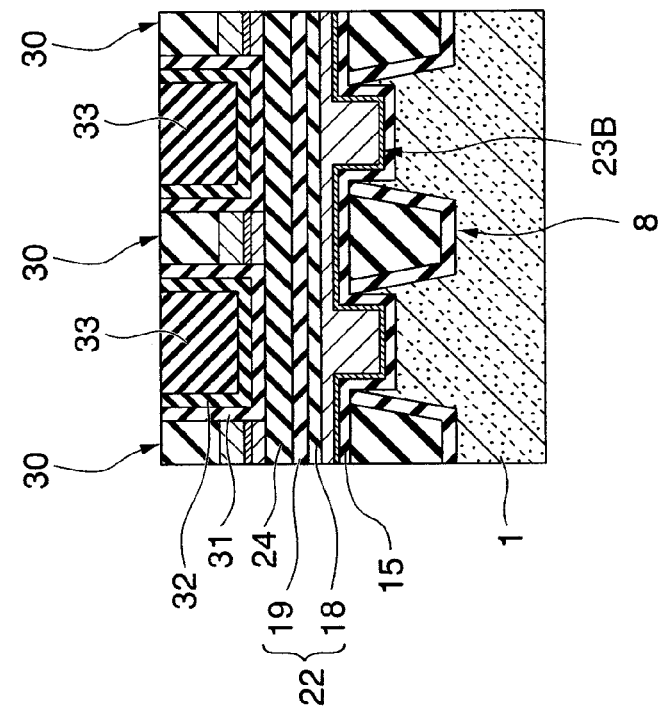

Then, a poly-silicon film containing phosphorus is formed over the second inter-layer insulating film 34 so as to fill the capacitor contact hole 35, and then is etched. Thus, a poly-silicon layer 38, which fills a bottom portion of the capacitor contact hole 35, is formed as shown in FIGS. 20A and 20B. Then, a cobalt silicide (CoSi) layer 39 is formed over the poly-silicon layer 38. Then, a tungsten film is formed over the cobalt silicide layer 39 so as to fill the capacitor contact hole 35. Then, a surface of the tungsten film is planarized by a CMP process until a surface of the SOD film 33 is exposed. Thus, a tungsten layer 40 is formed. Thus, a capacitor contact plug 41, which includes the poly-silicon layer 38, the cobalt silicide layer 39, and the tungsten layer 40, is formed.

Figure 21A:
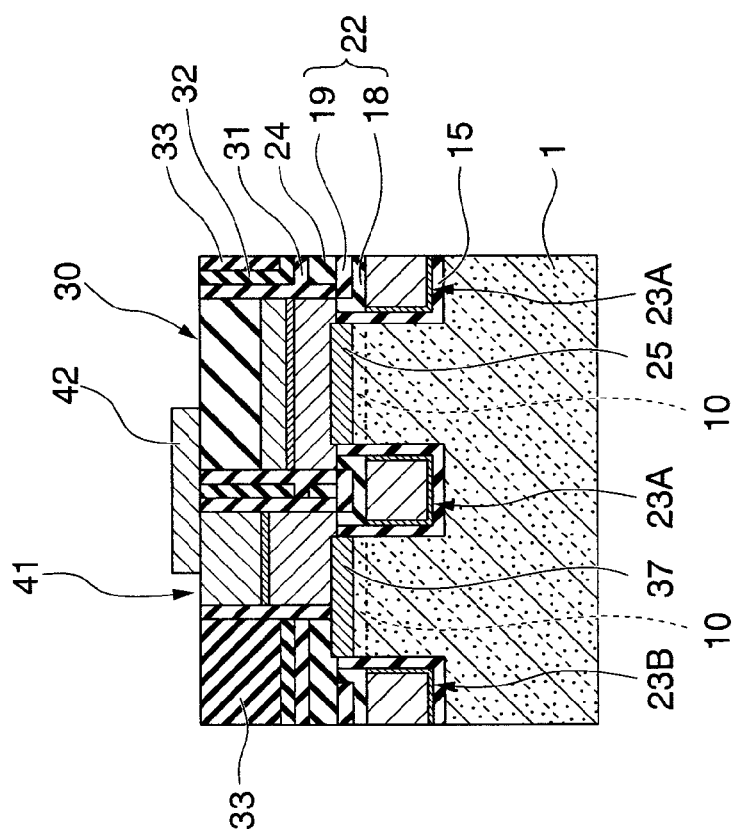
Figure 21B:
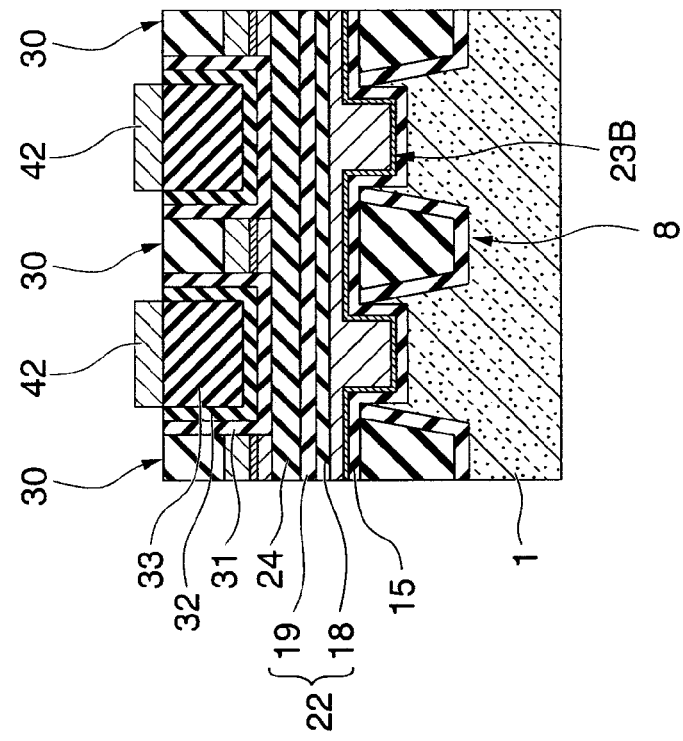

In the process of forming the capacitor, a multi-layered film including a tungsten nitride (WN) film and a tungsten film is formed over the upper surface of the semiconductor substrate 1 after the capacitor contact plug 41 is formed. Then, the multi-layered film is patterned to form a capacitor contact pad 42, as shown in FIGS. 21A and 21B. The capacitor contact pads 42 are formed at a predetermine interval. For this reason, the center position of the capacitor contact pad 42 is deviated from the center position of the capacitor contact plug 41, as shown in FIGS. 1 and 21B. However, the capacitor contact pad 42 overlaps the capacitor contact plug 41 in plan view, and is connected to the capacitor contact plug 41.

Then, a stopper film 43 is formed so as to cover the capacitor contact pad 42, as shown in FIGS. 22A and 22B. The stopper film 43 is made of a silicon nitride film or the like. Then, a third inter-layer insulating film 44, which is made of a silicon oxide film or the like, is formed over the stopper film 43.

Figure 23A:
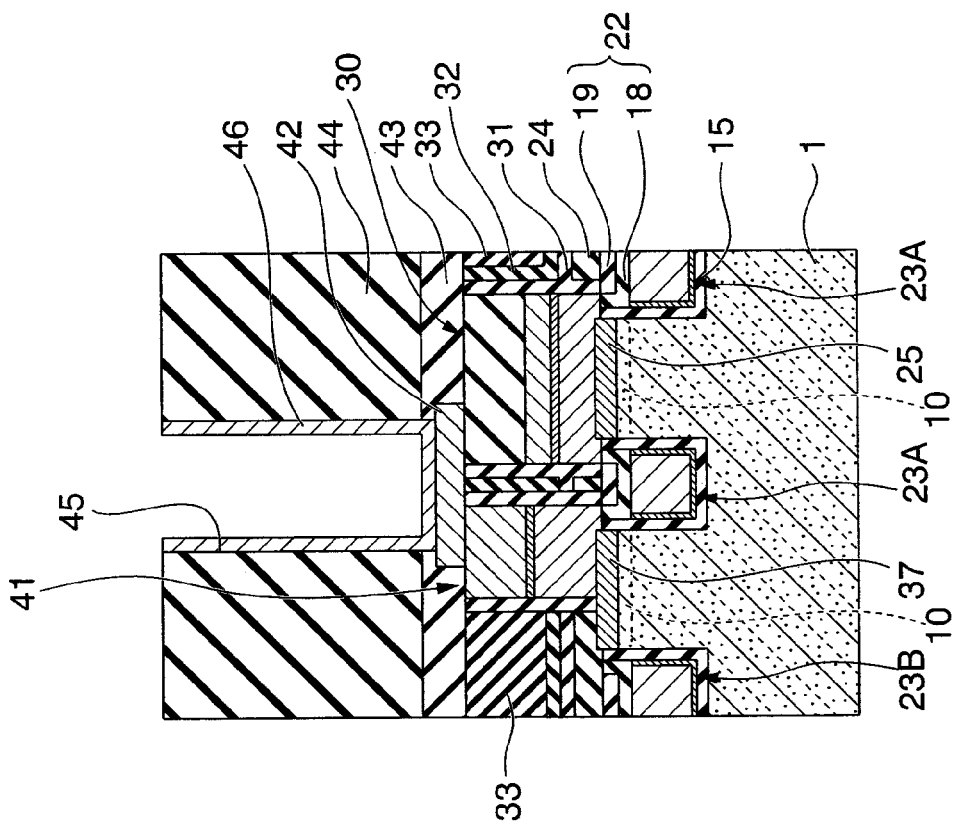
Figure 23B:
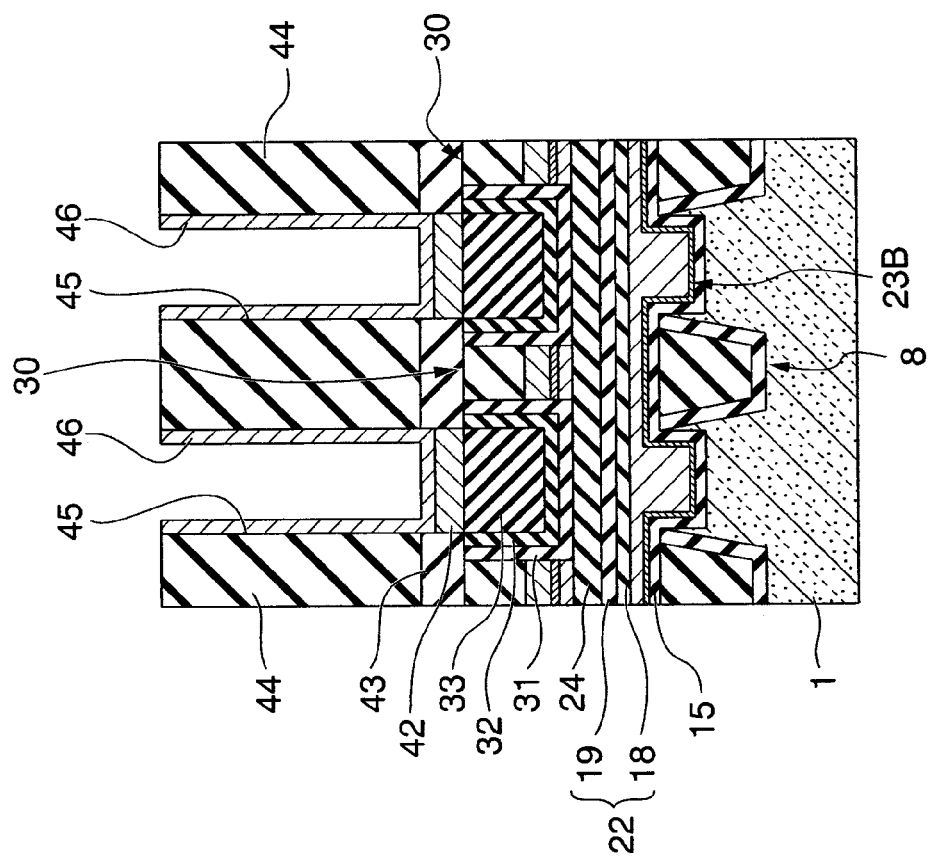

Then, a contact hole 45, which penetrates the third inter-layer insulating film 44 and part of the stopper film 43, is formed so as to partially expose the upper surface of the capacitor contact pad 42, as shown in FIGS. 23A and 23B. Then, a lower electrode 46 as a capacitor element is formed so as to cover a side surface of the contact hole 45 and the upper surface of the capacitor contact pad 42. The lower electrode 46 is made of titanium nitride or the like. Thus, a bottom surface of the lower electrode 46 is in contact with the upper surface of the capacitor contact pad 42.

Figure 24A:
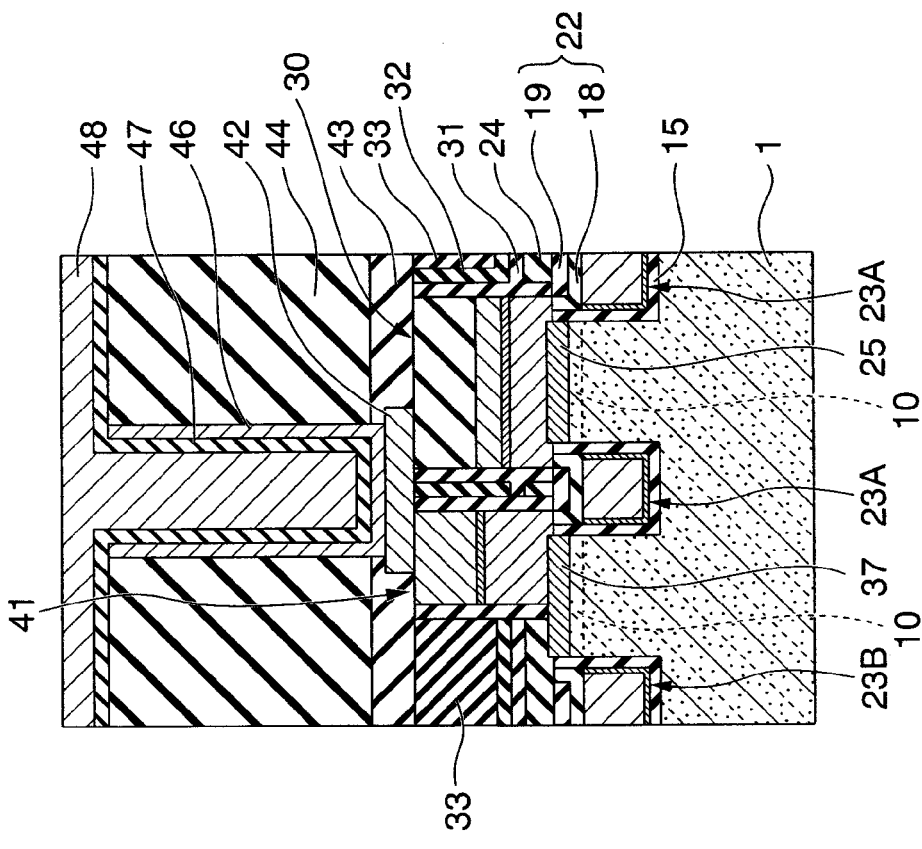
Figure 24B:
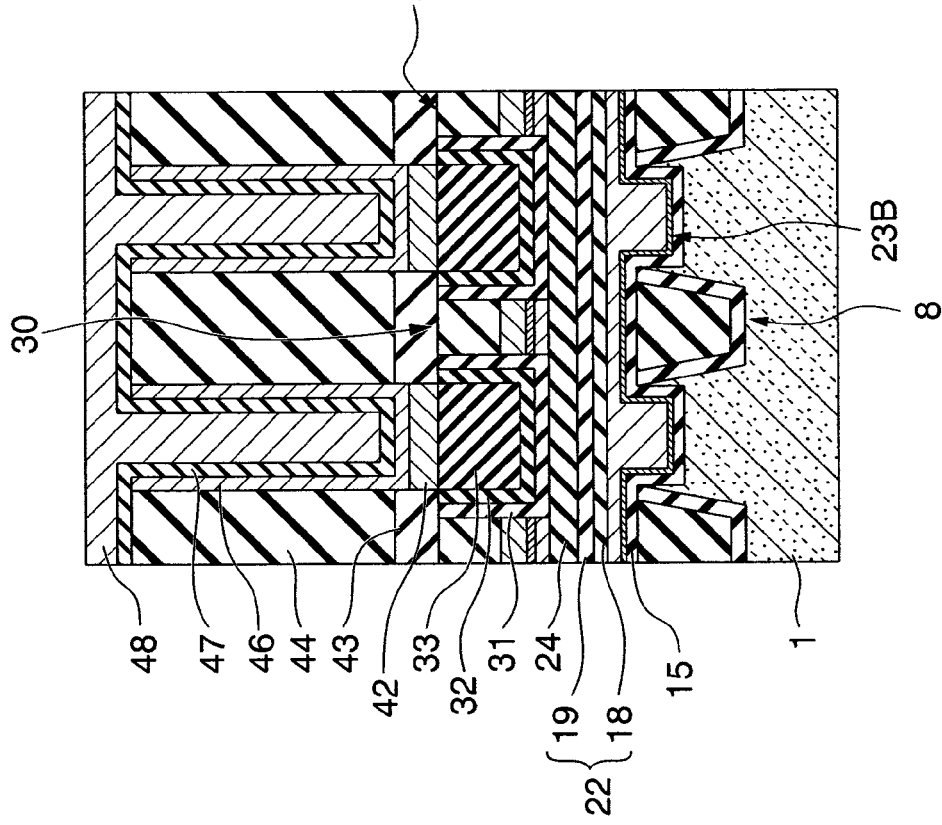

Then, a capacitor insulating film 47 is formed so as to cover the lower electrode 46 and the upper surface of the third inter-layer insulating film 44, as shown in FIGS. 24A and 24B. As the capacitor insulating film 47, a zirconium oxide ($ZrO_2$) film, an aluminum oxide ($Al_2O_3$) film, a hafnium oxide ($HfO_2$) film, a multi-layered film including these films, or the like may be used. Then, an upper electrode 48 as a capacitor element is formed so as to cover the capacitor insulating film 47. The upper electrode 48 is made of titanium nitride or the like. Thus, the capacitor is formed.

Figure 25A:
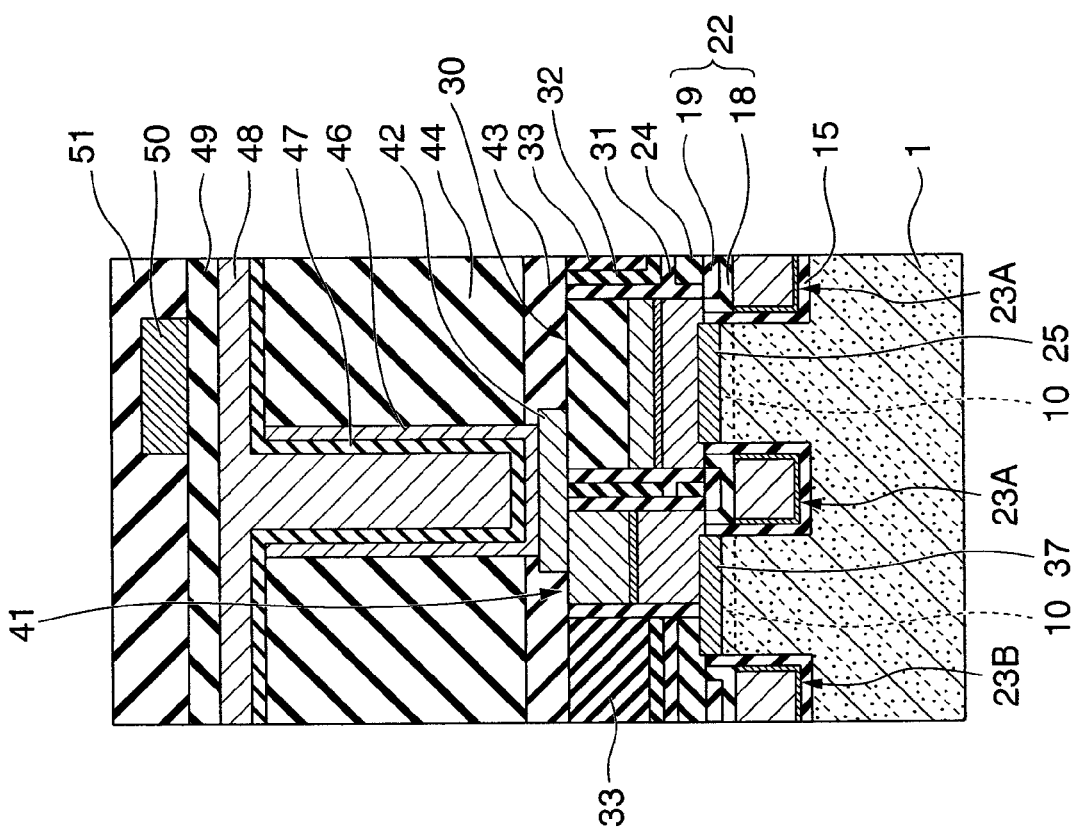
Figure 25B:
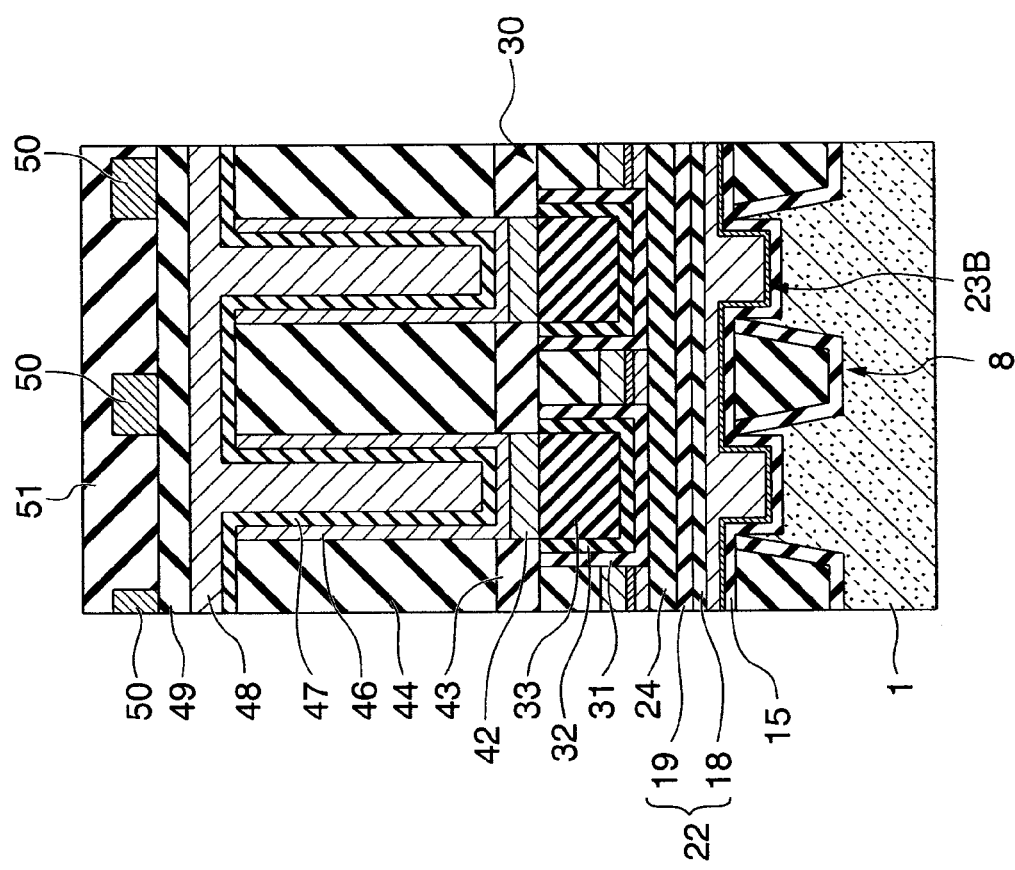

In the process forming the wiring layer, a fourth inter-layer insulating film 49 is formed over the upper electrode 48, as shown in FIGS. 25A and 25B. The fourth inter-layer insulating film 49 is made of a silicon oxide film or the like. Then, an upper metal wire 50, which is made of aluminum (Al), copper (Cu), or the like, is formed over the fourth inter-layer insulating film 49. Then, a protection film 51 is formed so as to cover the upper metal wire 50. Thus, the DRAM of the first embodiment is completed.

According to the manufacturing method of the first embodiment, a variation in width of the element formation groove 4 that defines the planar shape of the STI film 8 is small. Accordingly, a variation in aspect ratio of the device isolation groove 4 is small when the silicon nitride film 6 and the silicon oxide film 7 are formed so as to fill the device isolation groove 4. For this reason, the device isolation groove 4 can be filled with the two-layered film including the silicon nitride film 6 and the silicon oxide film 7 without causing defectives, such as voids, to be included in the linear grooves 421, the first connection grooves 422, and the second connection grooves 423, as shown in FIG. 5A. Accordingly, a DRAM including the linear groove 421 with the narrow width d1 can be manufactured without decreasing a yield.

Additionally, the device isolation groove 4 is more easily and properly filled with the double-layered insulating film, which includes the lower silicon nitride film 6 and the upper silicon oxide film 7, than when the device isolation groove 4 is filled with a single-layered insulating film.

Although it has been explained in the first embodiment that the device isolation groove 4 is filled with the double-layered insulating film including the lower silicon nitride film 6 and the upper silicon oxide film 7, the present invention is not limited thereto. For example, the device isolation groove 4 may be filled with a single-layered insulating film.

Second Embodiment

Hereinafter, a semiconductor device according to a second embodiment of the present invention is explained. FIGS. 27A and 27B illustrate a memory cell of the semiconductor device of the second embodiment. FIG. 27A is a cross-sectional view taken along the line A-A' shown in FIG. 1. FIG. 27B is a cross-sectional view taken along the line B-B' shown in FIG. 1. The memory cell shown in FIGS. 27A and 27B includes a recessed gate transistor in which word lines are fully buried in a semiconductor substrate. The difference from the first embodiment is only the structure of the recessed gate transistor. For this reason, like reference numerals denote like elements between the first and second embodiments, and explanations thereof are omitted here.

In the case of the recessed gate transistor of the second embodiment, part of a buried wire 223 is buried in an upper portion of each STI film 208, as shown in FIG. 27A. In other words, the top level of the STI film 208 is lower than the top level of the semiconductor substrate 1 between adjacent STI films 208. Thus, the semiconductor substrate 1 includes saddle-shaped silicon portions 214 extending upwardly. The STI film 208 is positioned between the silicon portions 214. The buried wire 223 is isolated from the silicon portions 214 by a gate insulating film 15.

The buried wire 223 includes a word line (first wire) 233A and a device isolation wire 233B (second wire). The word line 233A and the device isolation wire 233B have the same structure. Accordingly, the saddle-shaped silicon portions 214 are formed with respect to the word line 233A and the device isolation wire 233B in a similar manner.

The saddle-shaped silicon portion 214 functions as a channel when the voltage difference between the source and drain regions exceeds a threshold. The recessed gate transistor of the second embodiment is a saddle-shaped fin transistor including the silicon portion 214 as a channel, thereby increasing the amount of on-current.

Hereinafter, a method of manufacturing the saddle-shaped fin transistor is explained. The process of forming the STI film 208 (shown in FIGS. 3A to 6B) and the hard mask formation process included in the process of forming the buried wires 223 (shown in FIGS. 7A and 7B) are the same as those of the first embodiment. Therefore, explanations thereof are omitted here.

Figure 28B:
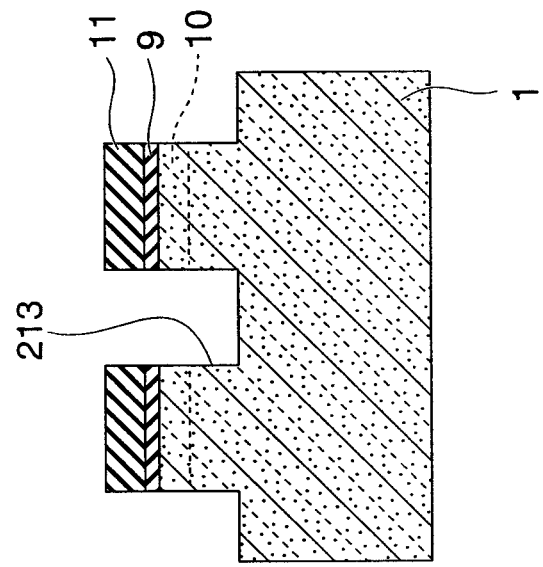
FIGS. 28B and 29B are cross-sectional views taken along line B-B' illustrating the process flow according to the second embodiment.
Figure 28A:
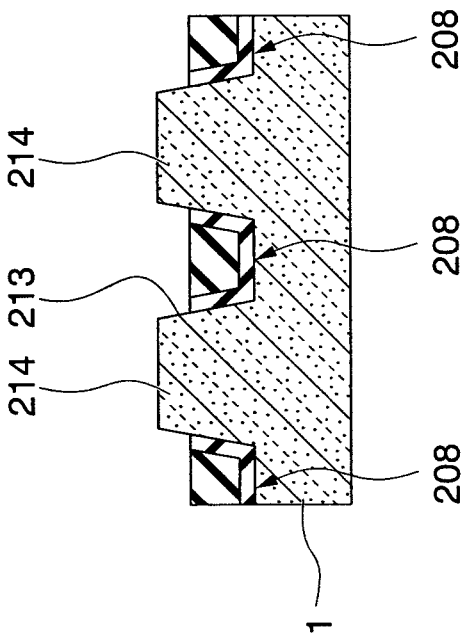
FIGS. 28A and 29A are cross-sectional views taken along line A-A' illustrating a process flow indicative of a method of manufacturing the semiconductor device according to the second embodiment.

After the process shown in FIGS. 7A and 7B, the semiconductor substrate 1 is thy-etched using the hard mask to form a gate electrode trench 213, as shown in FIGS. 28A and 28B. In this case, the STI film 208 is more-deeply etched than a silicon layer of the semiconductor substrate 1. Thus, the saddle-shaped silicon portion 214, the top level of which is higher than the top level of the etched STI film 208, remains adjacent to the gate electrode trench 213. The saddle-shaped silicon portion 214 functions as a channel region of the transistor.

Figure 29B:
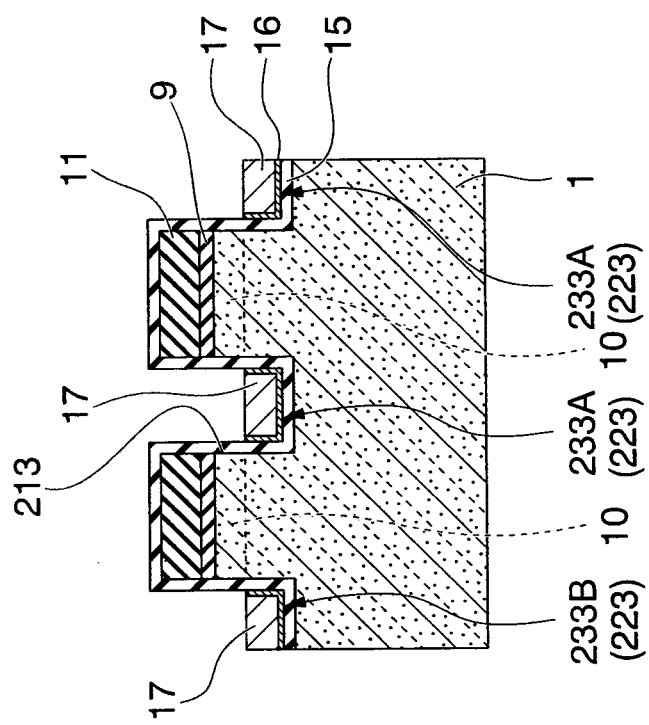
Figure 29A:
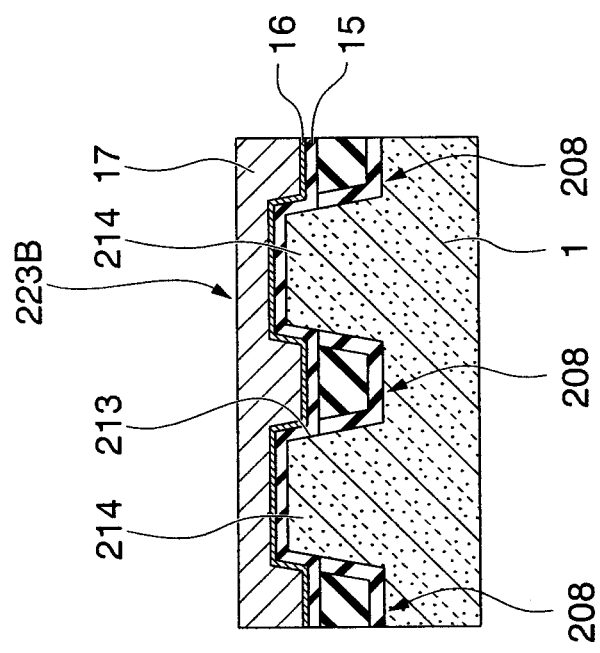

Then, the gate insulating film 15 is formed so as to cover the exposed side surface of the gate electrode trench 213, the upper surface of the STI film 208, and the upper surface of the semiconductor substrate 1, as shown in FIGS. 29A and 29B. Then, gate electrode materials are formed over the gate insulating film 15 so as to fill the gate electrode trench 213. Then, the gate electrode material film is etched. Thus, the titanium nitride film 16 and the tungsten film 17, which are the gate electrode material films, are formed so as to fill only a bottom portion of the gate electrode trench 213, as shown in FIG. 29B. Thus, the buried wires 223, which include word lines (gate electrodes) 233A and device isolation wires 233B, are formed.

The following processes are similar to those of the first embodiment, and therefore explanations thereof are omitted here.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

It is apparent that the present invention is not limited to the above embodiments, and may be modified and changed without departing from the scope and spirit of the invention.

Although recessed channel transistors, in which the word lines are fully buried in the semiconductor substrate, have been taken as examples to explain the first and second embodiments, the present invention is not limited thereto, and is applicable to various recessed transistors.

In addition, while not specifically claimed in the claim section, the application reserves the right to include in the claim section at any appropriate time the following method.

A method of manufacturing a semiconductor device includes the following processes. First to fifth device isolation grooves are formed in a semiconductor substrate so as to satisfy the following conditions. The first device isolation groove has a first end portion. The second device isolation groove extends from the first end portion. The second device isolation groove has a second end portion other than the first end portion. The third device isolation groove extends from the second end portion. The third device isolation groove has a third end portion other than the second end portion. The first and third device isolation grooves are positioned on the same side with respect to the second device isolation groove. The fourth device isolation groove extends from the third end portion. The fourth device isolation groove has a fourth end portion other than the third end portion. The second and fourth device isolation grooves are positioned on the opposite side with respect to the third device isolation groove. The fifth device isolation groove extends from the fourth end portion. The third and fifth device isolation grooves are positioned on the same side with respect to the fourth device isolation groove. Then, an insulating film, which fills the first to fifth grooves, is formed.

What is claimed is:

1. A semiconductor device comprising:
a semiconductor substrate having a device isolation groove defining first to fourth device formation portions,
the second device formation portion facing to the first device formation portion,
the third device formation portion connecting to the first device formation portion in a first direction so that the third device formation portion does not reach the second device formation portion,
the fourth device formation portion connecting to the second device formation portion in opposite the first direction so that the fourth device formation portion does not reach the first device formation portion,
a plurality of wiring portions crossing over the third and fourth device formation portions, the plurality of wiring portions comprising a first wiring portion,
wherein the third and fourth device formation portions are positioned adjacently between the first and second device formation portions,
wherein the third and fourth device formation portions have first and second trenches, respectively, and
wherein the first wiring portion fills the first and second trenches.

2. The semiconductor device according to claim 1, wherein the first device formation portion is substantially parallel to the second device formation portion, and
the third device formation portion is substantially parallel to the fourth device formation portion.

3. The semiconductor device according to claim 2, wherein a first distance between the second device formation portion and the third device formation portion, a second distance between the third and fourth device formation portions, and a third distance between the first device formation portion and the fourth device formation portion are the same.

4. The semiconductor device according to claim 1, wherein the device isolation groove further defines a fifth device formation portion extending from the first device formation portion,
the fifth device formation portion is separated from the second and fourth device formation portions,
the third to fifth device formation portions are positioned between the first and second device formation portions, and
the fourth device formation portion is positioned between the third and fifth device formation portions.

5. The semiconductor device according to claim 4, wherein the first device formation portion is substantially parallel to the second device formation portion, and
the third to fifth device formation portions are substantially parallel to one another.

6. The semiconductor device according to claim 5, wherein a first distance between the second device formation portion and the third device formation portion, a second distance between the third and fourth device formation portions, a third distance between the first device formation portion and the fourth device formation portion, a fourth distance between the fourth and fifth device formation portions, and a fifth distance between the second device formation portion and the fifth device formation portion are the same.

7. The semiconductor device according to claim 1, wherein the first wiring portion functions as a gate electrode.

8. The semiconductor device according to claim 1, wherein the first wiring portion is kept at a predetermined voltage and functions as a device isolation portion.

9. The semiconductor device according to claim 1, wherein
the third and fourth device formation portions have third and fourth trenches, respectively,
the plurality of wiring portions comprising a second wiring portion, and
the second wiring portion fills the third and forth trenches.

10. The semiconductor device according to claim 9, wherein
the third device formation portion has a first protruding sub-portion defined by the first and third trenches,
the fourth device formation portion has a second protruding sub-portion defined by the second and fourth trenches,
the first protruding sub-portion having a first top surface region containing a first impurity, and
the second protruding sub-portion having a second top surface region containing a second impurity.

11. The semiconductor device according to claim 1, further comprising:
an insulating film filling the device isolation groove.

12. A semiconductor device comprising:
a semiconductor substrate having first to fifth device isolation grooves,
the first device isolation groove having a first end portion and a second end portion,
the second device isolation groove extending from the second end portion, the second device isolation groove having a third end portion other than the second end portion,
the third device isolation groove extending from the third end portion, the third device isolation groove having a fourth end portion other than the third end portion, the third device isolation groove having a first end in the third end portion, a second end in the fourth end portion, the first end and the second end facing each other, and the first and third device isolation grooves being positioned on the same side with respect to the second device isolation groove,
the fourth device isolation groove extending from the fourth end portion, the fourth device isolation groove having a fifth end portion other than the fourth end portion, and the second and fourth device isolation grooves being positioned on the opposite side with respect to the third device isolation groove,
the fifth device isolation groove extending from the fifth end portion and having a sixth end portion, and the third and fifth device isolation grooves being positioned on the same side with respect to the fourth device isolation groove,
wherein the fourth device isolation groove has a first width from the second end toward the first end,
wherein a first point is positioned at a length from the second end, the length being smaller than the first width,
wherein a second point is positioned at the length from an end of the first end portion of the first device isolation groove toward the second end portion, and
wherein a first device formation portion is provided on a first line connecting the first and second points with a first straight line.

13. The semiconductor device according to claim 12, wherein
the first, third, and fifth device isolation grooves are substantially parallel to one another, and
the second and fourth device isolation grooves are substantially parallel to each other.

14. The semiconductor device according to claim 12, wherein the first to fifth device isolation grooves have the same short-side width.

15. The semiconductor device according to claim 12, further comprising:
a first insulating film filling up the first to fifth device isolation grooves.

16. The semiconductor device according to claim 12, further comprising:
a second insulating film filling a bottom portion of the device isolation groove.

17. The semiconductor device according to claim 12,
wherein the second device isolation groove has a second width from the first end toward the second end,
wherein a third point is positioned at the length from the first end,
wherein a fourth point is positioned at the length from an end of the sixth end portion of the fifth device isolation groove toward the fifth end portion, and
wherein a second device formation portion is provided on a second line connecting the third and fourth points with a second straight line.

18. A semiconductor device comprising:
a semiconductor substrate having a device isolation groove defining first to fourth device formation portions,
the second device formation portion facing to the first device formation portion,
the third device formation portion extending from the first device formation portion to a first direction so that the third device formation portion does not reach the second device formation portion,
the fourth device formation portion extending from the second device formation portion to opposite the first direction so that the fourth device formation portion does not reach the first device formation portion,
wherein the third and fourth device formation portions are positioned adjacently between the first and second device formation portions,
wherein the first and second device formation portions each extend in a second direction different from the first direction,
wherein the first to fourth device formation portions are formed as a single planar structure defining a plane,
wherein the third device formation portion connects to the first device formation portion in the plane, and
wherein the fourth device formation portion connects to the second device formation portion in the plane.

19. The semiconductor device according to claim 18, wherein a first distance between the second device formation portion and the third device formation portion, a second distance between the third and fourth device formation portions, and a third distance between the first device formation portion and the fourth device formation portion are the same.

20. The semiconductor device according to claim 18, wherein
the device isolation groove further defines a fifth device formation portion extending from the first device formation portion, the fifth device formation portion is separated from the second and fourth device formation portions,
the third to fifth device formation portions are positioned between the first and second device formation portions, and
the fourth device formation portion is positioned between the third and fifth device formation portions.

* * * * *